(12) United States Patent
Ipek et al.

(10) Patent No.: US 11,636,057 B2
(45) Date of Patent: Apr. 25, 2023

(54) DATA RE-ENCODING FOR ENERGY-EFFICIENT DATA TRANSFER IN A COMPUTING DEVICE

(71) Applicant: QUALCOMM INCORPORATED, San Diego, CA (US)

(72) Inventors: Engin Ipek, San Diego, CA (US); Bohuslav Rychlik, San Diego, CA (US); George Patsilaras, San Diego, CA (US); Prajakt Kulkarni, San Diego, CA (US); Can Hankendi, San Diego, CA (US); Fahad Ali, San Diego, CA (US); Jeffrey Gemar, San Diego, CA (US); Matthew Severson, Austin, TX (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 17/390,215

(22) Filed: Jul. 30, 2021

(65) Prior Publication Data

US 2023/0031310 A1    Feb. 2, 2023

(51) Int. Cl.
  *G06F 13/16*    (2006.01)
  *H03M 5/14*    (2006.01)

(52) U.S. Cl.
  CPC ...... *G06F 13/1694* (2013.01); *G06F 13/1689* (2013.01); *H03M 5/145* (2013.01); *G06F 2213/0038* (2013.01)

(58) Field of Classification Search
  CPC . H03M 5/145; G06F 13/1694; G06F 13/1689
  (Continued)

(56) References Cited

U.S. PATENT DOCUMENTS 10,320,421 B2    6/2019    Freudenberger et al.
10,725,841 B1*   7/2020    Rahul ................. H03M 13/618
(Continued)

OTHER PUBLICATIONS

Corresponding-Related PCT Patent App. Ser. No. PCT/US2022/033967, Filed Jun. 17, 2022, claims priority to the present application (U.S. Appl. No. 17/390,215), ISA 210-220-237, Written Opinion of the International Search Authority (ISA) = European Patent Office (EPO); Transmitted on Oct. 6, 2022.
(Continued)

*Primary Examiner* — Lam T Mai
(74) *Attorney, Agent, or Firm* — Smith Tempel Blaha LLC/Qualcomm

(57) ABSTRACT

The energy consumed by data transfer in a computing device may be reduced by transferring data that has been encoded in a manner that reduces the number of one "1" data values, the number of signal level transitions, or both. A data destination component of the computing device may receive data encoded in such a manner from a data source component of the computing device over a data communication interconnect, such as an off-chip interconnect. The data may be encoded using minimum Hamming weight encoding, which reduces the number of one "1" data values. The received data may be decoded using minimum Hamming weight decoding. For other computing devices, the data may be encoded using maximum Hamming weight encoding,
(Continued)

which increases the number of one "1" data values while reducing the number of zero "0" values, if reducing the number of zero values reduces energy consumption.

46 Claims, 16 Drawing Sheets

(58) Field of Classification Search
USPC ..................................................... 341/50–95
See application file for complete search history.

(56) References Cited

U.S. PATENT DOCUMENTS

| | | | | |
|---|---|---|---|---|
| 10,826,536 | B1* | 11/2020 | Beukema | H03M 13/19 |
| 10,944,435 | B1* | 3/2021 | Fay | G06F 11/1012 |
| 2008/0140987 | A1 | 6/2008 | Rixner et al. | |
| 2013/0107611 | A1* | 5/2013 | Cai | G11C 11/1673 |
| | | | | 365/158 |
| 2015/0121164 | A1* | 4/2015 | Kamali | H03M 13/31 |
| | | | | 714/758 |
| 2016/0352359 | A1* | 12/2016 | Ordentlich | H03M 13/1575 |
| 2018/0041229 | A1* | 2/2018 | Yazdi | H03M 13/19 |
| 2018/0210858 | A1 | 7/2018 | Chu | |

OTHER PUBLICATIONS

Corresponding-Related PCT Patent App. Ser. No. PCT/US2022/033967, Filed Jun. 17, 2022, claims priority to the present application (U.S. Appl. No. 17/390,215), ISA 210-220-237, Written Opinion of the International Search Authority (ISA)=European Patent Office (EPO); dated Oct. 6, 2022.

Behnam Payman, "SFTL Energy-Efficient Data Movement with Slow Transition Fast Level Signaling," Designing Interactive Systems Conference, Jun. 2, 2019, pp. 1-6, New York, New York; ISBN 978-1-4503-5850-7.

Jacob Lofvenberg, "Coding Circuits for Reducing Hamming Weight," Jan. 31, 2005, pp. 1-5, Department of Electrical Engineering Linkopings Universitet, SE-581 83 Linkoping, Sweden.

Behnam Payman et al., "STFL-DDR: Improving the Energy-Efficiency of Memory Interface," IEEE Transactions on Computers, IEEE, USA, vol. 69, No. 12, Mar. 6, 2020, pp. 1823-1834; ISSN: 0018-9340.

* cited by examiner

DATA RE-ENCODING FOR ENERGY-EFFICIENT DATA TRANSFER IN A COMPUTING DEVICE

DESCRIPTION OF THE RELATED ART

A computing device may include multiple subsystems that communicate with one another. Such a computing device may be, for example, a portable computing device ("PCD"), such as a laptop or palmtop computer, a cellular telephone or smartphone, portable digital assistant, portable game console, etc. Still other types of PCDs may be used in automotive and Internet-of-Things ("IoT") applications.

The communicating subsystems may be included within the same integrated circuit chip or in different chips. A "system-on-a-chip" or "SoC" is an example of one such chip that integrates numerous components to provide system-level functionality. For example, an SoC may include one or more types of processors, such as central processing units ("CPU"s), graphics processing units ("GPU"s), digital signal processors ("DSP"s), and neural processing units ("NPU"s). An SoC may include other subsystems, such as a transceiver or "modem" subsystem that provides wireless connectivity, a memory subsystem, etc.

An SoC commonly includes buses or other on-chip interconnects through which data is communicated among subsystems or other components in the SoC. Some PCDs may provide a portion of the subsystems in the SoC and another portion in one or more other chips connected to the SoC. In such a PCD, the SoC and other chips include off-chip interconnects through which data is conveyed between the chips.

As a PCD is commonly powered by a battery, energy conservation plays an important role in providing a satisfying user experience. Operating logic elements to process data is one source of energy consumption. Another source of energy consumption is transferring data across on-chip and off-chip interconnects. Improvements in reducing energy consumption from data transfer would be desirable.

SUMMARY OF THE DISCLOSURE

Systems, methods, computer-readable media, and other examples are disclosed for transferring data in a computing device. The energy consumed by data transfer in a computing device may be reduced by transferring data that has been encoded in a manner that reduces the number of "1" data values, the number of signal level transitions, or both. Depending upon the computing device, the energy consumed by data transfer may also be reduced by reducing the number of "0" data values, if "0" data values consume more energy than "1" data values.

An exemplary method for transferring data in a computing device may include receiving, by a data destination component of the computing device, encoded data from a data source component of the computing device over a data communication interconnect. The encoded data may comprise minimum Hamming weight-encoded data. The exemplary method may further include decoding the encoded data received over the data communication interconnect.

An exemplary system for transferring data in a computing device may include a data source component and a data destination component. The data destination component may be configured to receive encoded data from the data source component over a data communication interconnect. The encoded data may comprise minimum Hamming weight-encoded data. The data destination component may further be configured to decode the encoded data received over the data communication interconnect.

Another exemplary system for transferring data in a computing device may include means for receiving encoded data by a data destination component of the computing device from a data source component of the computing device over a data communication interconnect. The encoded data may comprise minimum Hamming weight-encoded data. The exemplary system may further include means for decoding the encoded data received over the data communication interconnect.

An exemplary computer-readable medium for transferring data in a computing device may comprise a non-transitory computer-readable medium having instructions stored thereon in computer-executable form. The instructions, when executed by a processing system of the computing device, may configure the processing system to receive, at a data destination component of the computing device, encoded data from a data source component of the computing device over a data communication interconnect. The encoded data may comprise minimum Hamming weight-encoded data. The instructions may further configure the processing system to decode the encoded data received over the data communication interconnect.

As noted above, depending on the type of memory interface (e.g., DDR4 vs. LPDDR5), it may be either the ones "1s" values or the zeroes "0s" values in data that may consume termination power. Therefore, this disclosure is not limited to "minimum Hamming weight encoding" involving encoding data to have the fewest ones "1s". The disclosure may also cover "maximizing Hamming weight encoding" if minimizing the number of zeroes "0s" may reduce termination power based on the type of memory interface, such as a DDR interface, being employed.

BRIEF DESCRIPTION OF THE DRAWINGS

In the Figures, like reference numerals refer to like parts throughout the various views unless otherwise indicated. For reference numerals with letter character designations such as "102A" or "102B", the letter character designations may differentiate two like parts or elements present in the same Figure. Letter character designations for reference numerals may be omitted when it is intended that a reference numeral to encompass all parts having the same reference numeral in all Figures.

DETAILED DESCRIPTION

The word "exemplary" is used herein to mean "serving as an example, instance, or illustration." The word "illustrative" may be used herein synonymously with "exemplary." Any aspect described herein as "exemplary" is not necessarily to be construed as preferred or advantageous over other aspects.

Data transfer across interconnects is a significant consumer of energy in systems comprising integrated circuit chips. Such data interconnects include off-chip interconnects, through which data may be transferred between chips (or between a chip and another component). Such data interconnects also include on-chip interconnects, through which data may be transferred between subsystems of a chip.

Figure 1A:
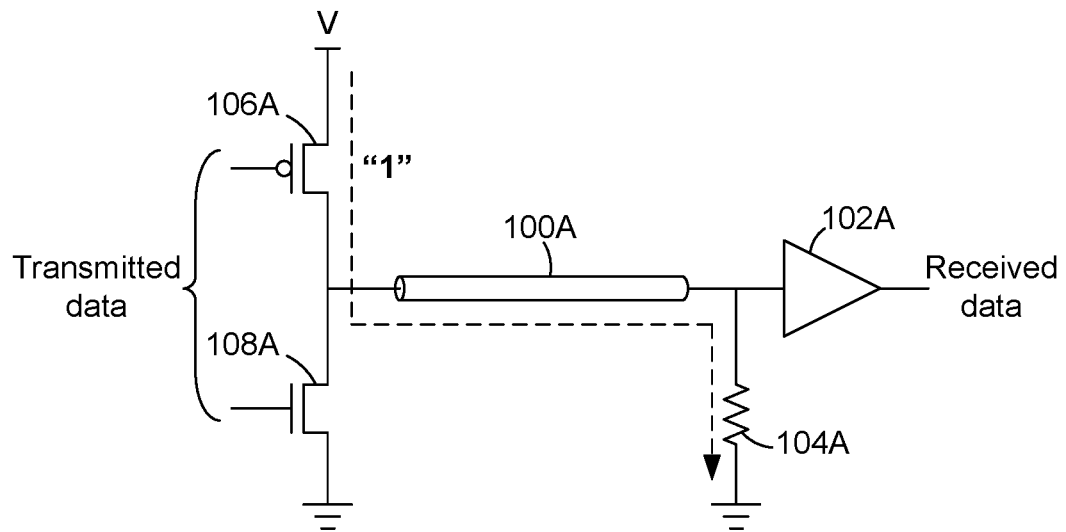
FIG. 1A is a circuit diagram illustrating a terminated data communication interconnect.

As illustrated in FIG. 1A, on the receiver side of an off-chip data interconnect 100A a data receiver 102A may be terminated by a resistance 104A. On the transmitter side of the off-chip interconnect 100A two complementary transistors 106A and 108A may be coupled between a supply voltage ("V") and ground. Note that to transmit a "1" or high signal level over the off-chip interconnect 100A, the transistors 106A and 108A are activated, thereby providing a current (indicated by the broken-line arrow) through the resistance 104A and consuming power.

Although not depicted in FIG. 1, to transmit a "0" or low signal level over the off-chip interconnect 100A, the transistors 106A and 108A are not activated, thereby providing no current through the resistance 102A. From the foregoing, it may be appreciated that transferring data across the off-chip data interconnect 100A only consumes power when the data is a "1" (i.e., high signal level). Accordingly, it may be appreciated that power consumption from transferring data across the off-chip (i.e., terminated) data interconnect 100A may be reduced by reducing the amount of "1"s in the data.

It is noted that in certain DRAM standards (e.g., DDR4), it is the bits that are set to a zero "0" value as opposed to those set to "1" values that consume significant energy. Thus, the present disclosure is not limited to minimizing the use or setting of "1" values. The present disclosure covers whichever bit consumes the most energy for memory in a portable computing device.

Figure 1B:
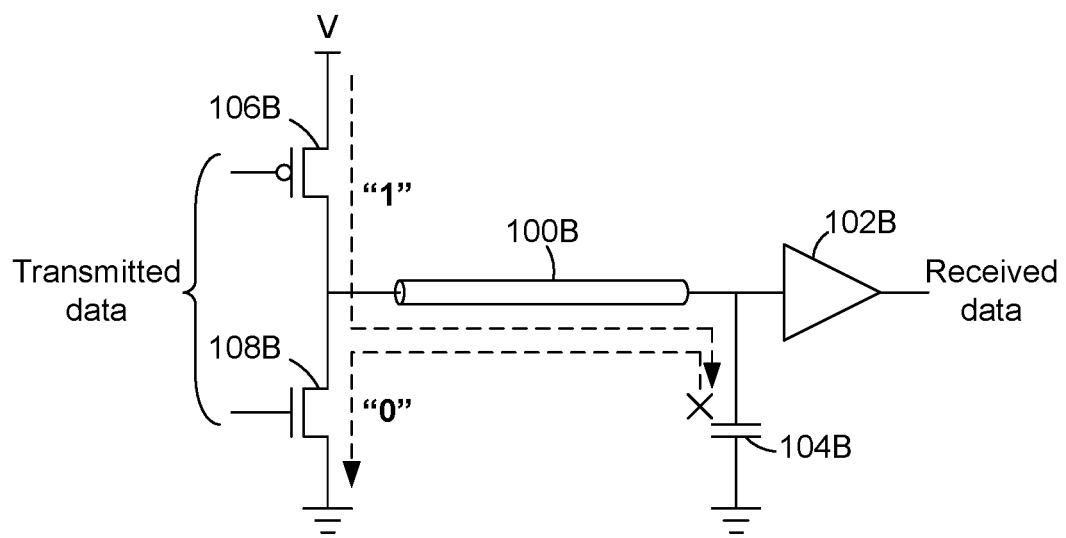
FIG. 1B is a circuit diagram illustrating an unterminated data communication interconnect.

As illustrated in FIG. 1B, on the receiver side of an on-chip data interconnect 100B a data receiver 102B may be unterminated. That is, the input of the data receiver 102B is coupled only to a capacitance 104B representing the intrinsic capacitance of the interconnect 100B as well as parasitic capacitances. On the transmitter side of the on-chip data interconnect 100B two complementary transistors 106B and 108B may be coupled between a supply voltage and ground. Note that when a "1" or high signal level is transmitted, the capacitance 104B blocks direct-current ("DC") to ground. Nevertheless, a "1" or high signal level charges the capacitance 104B, and therefore when a "0" or low signal level is subsequently transmitted over the off-chip interconnect 100B, the capacitance 104B discharges and enables a current. From the foregoing, it may be appreciated that transferring data across the on-chip (i.e., unterminated) data interconnect 100B consumes power when the data transitions between signal levels. Accordingly, it may be appreciated that power consumption from transferring data across the on-chip (i.e., unterminated) data interconnect 100B may be reduced by reducing the amount of data represented by signal level transitions.

Figure 2:
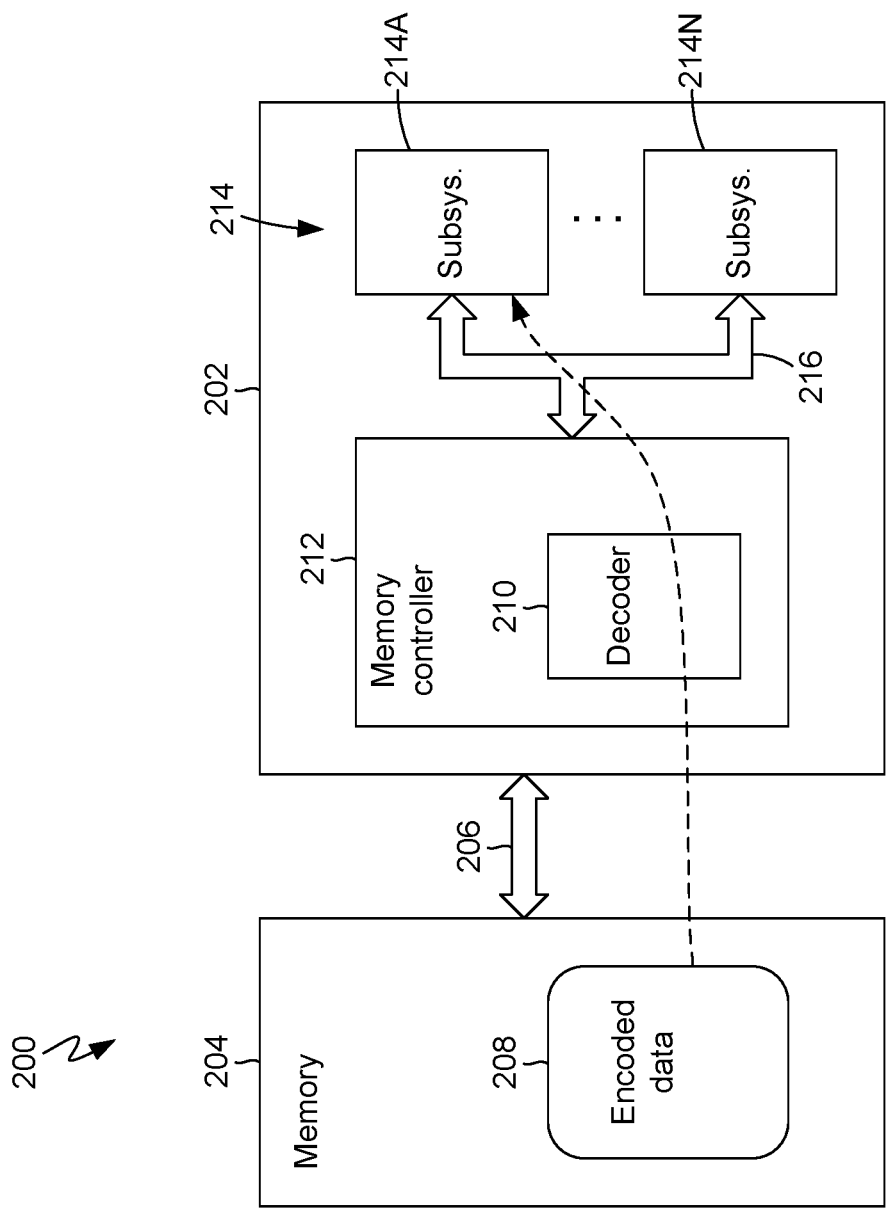
FIG. 2 is a block diagram illustrating a system for transferring data in a computing device, in accordance with exemplary embodiments.

As shown in FIG. 2, in an illustrative or exemplary embodiment a system 200 may include a system-on-a-chip ("SoC") 202 coupled to a memory system 204 by an off-chip data interconnect 206. Although not shown in FIG. 2 for purposes of clarity, the system 200 may be included in a computing device, such as, for example, a cellular telephone (e.g., smartphone), a satellite telephone, a laptop or palmtop computer, a tablet, a navigation device, a smartbook, a personal digital assistant ("PDA"), a portable game console, an Internet-of-Things ("IoT") device, an automotive computing device, etc. The SoC 202 and memory system 204 may be referred to as subsystems of such a computing device.

The memory system 204 may comprise any type and number of memory components (e.g., chips, dies, etc.) configured to store data. For example, the memory system 204 may comprise dynamic random access memory ("DRAM"), such as double data rate synchronous DRAM ("DDR-SDRAM"). In the illustrated embodiment the memory system 204 may be the main or system memory of the computing device, serving various subsystems of the computing device.

Encoded data 208 may be stored in the memory system 204. The memory system 204 may provide the encoded data 208 to the SoC 202 through the off-chip data interconnect 206. As described below, the encoded data 208 may be encoded in a manner that reduces the amount of "1"s, thereby improving the energy efficiency of data transfer over the off-chip data interconnect 206. The SoC 202 may include a decoder 210 that decodes the encoded data that the SoC 202 receives through the off-chip data interconnect 206. The decoder 210 may be included in, for example, a memory controller 212 that controls the flow of data to and from the memory system 204.

Data that is decoded by the decoder 210 may be provided to one or more subsystems 214 of the SoC 202, such as any of a first subsystem 214A through an Nth subsystem 214N. The subsystems 214 may include, for example, processor subsystems, such as central processing units ("CPU"s), graphics processing units ("GPU"s), digital signal processors ("DSP"s), neural processing units ("NPU"s), modem subsystems, etc. The encoded data may be provided to the SoC 202 in response to memory access requests (e.g., read requests) issued by a subsystem 214. The decoded data (decoded by the decoder 210) may be correspondingly provided to the subsystems 214 in response to such memory access requests.

The decoded data may be provided to the subsystems 214 via an on-chip data interconnect 216. In the illustrated embodiment, in which the decoder 210 is included in the memory controller 212, the on-chip data interconnect 216 may, in effect, couple the memory controller 212 and decoder 210 to the subsystems 214.

It should be understood that the encoded data 208 is stored in the memory system 204 in place of original data (not shown). The term "original data" refers to data that would have been read from the memory system 204 in response to memory access requests from the subsystems 214 but for the above-described encoding. That is, the encoding transforms or encodes the original data into the encoded data 208. The encoded data 208 has fewer "1"s than the original data, as described below.

As the memory system 204 provides the data across a data interconnect in this embodiment (FIG. 2), the memory system 204 may be referred to as a data source component. As the SoC 202 receives data from a data interconnect in this embodiment, the SoC 202 may be referred to as a data destination component. Nevertheless, in other embodiments (not shown in FIG. 2) other types of components may serve as such data source and destination components. Also, although in the system 200 the decoder 210 is included in the memory controller 212, in other embodiments such a decoder may be included in any other component.

Figure 3:
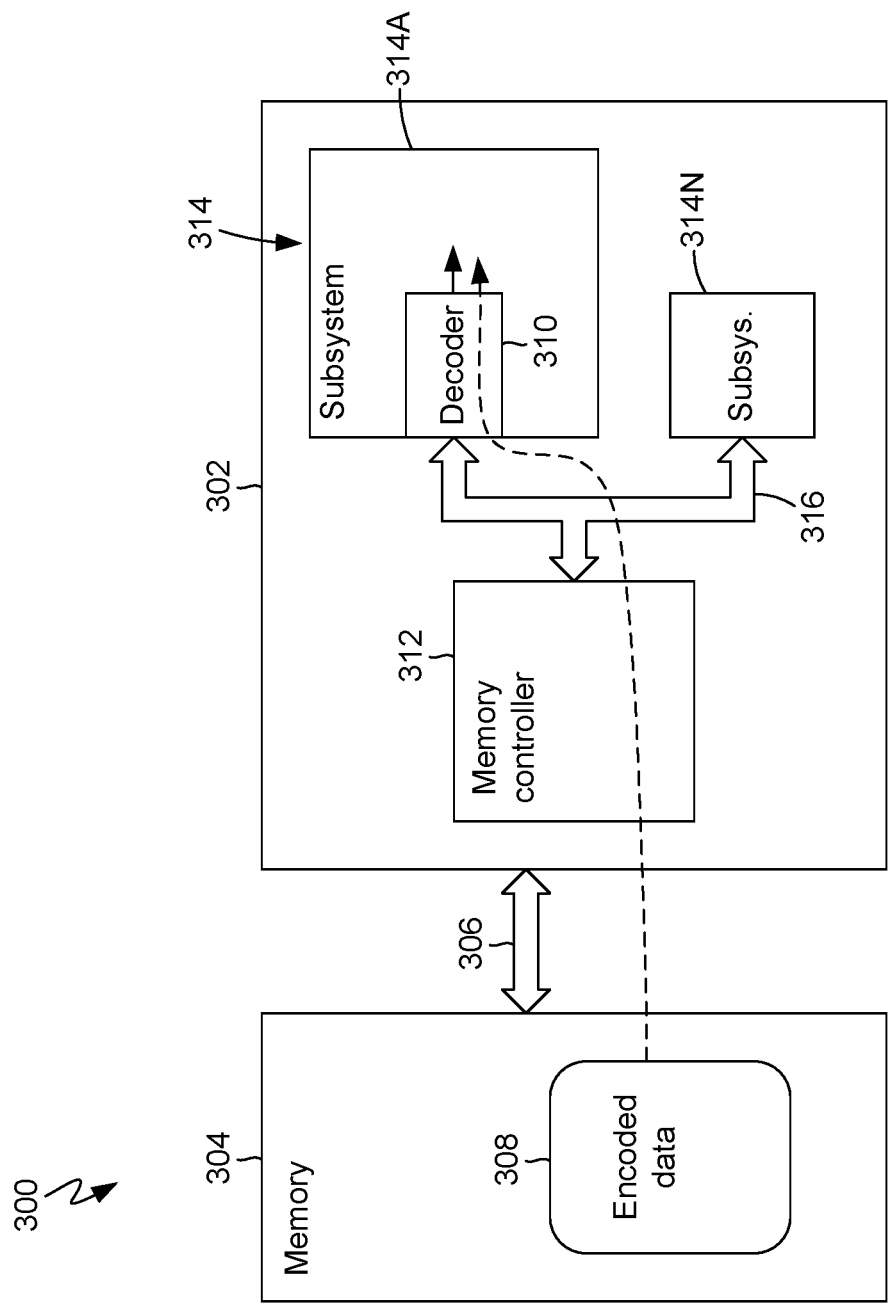
FIG. 3 is a block diagram illustrating a further system for transferring data in a computing device, in accordance with exemplary embodiments.

As shown in FIG. 3, in another illustrative or exemplary embodiment a system 300 may include an SoC 302 coupled to a memory system 304 by an off-chip data interconnect 306. Although not shown in FIG. 3 for purposes of clarity, the system 300 may be included in a computing device of any of the types described above with regard to the system 200 (FIG. 2). The memory system 304 may be similar to the above-described memory system 204 (FIG. 2). The SoC 302 and memory system 304 may be referred to as subsystems of the computing device.

Encoded data 308 may be stored in the memory system 304. The memory system 304 may provide the encoded data 308 to the SoC 302 through the off-chip data interconnect 306. As described below, the encoded data 308 may be encoded in a manner that reduces the amount of "1"s. The SoC 302 may include a decoder 310 that decodes the encoded data that the SoC 302 receives through the off-chip data interconnect 306. The decoder 310 may be included in, for example, any of a number of subsystems 314A through 314N (collectively referred to as the subsystems 314) of the SoC 302, such as the first subsystem 314A.

The subsystems 314 may be, for example, any of the types described above with regard to the subsystems 214 of the system 200 (FIG. 2). Data that is decoded by the decoder 310 may be provided to portions (not shown for purposes of clarity) of the subsystem 314A that process the data. For example, in an embodiment in which the subsystem 314A is a CPU, the decoded data may be provided to a processor core. A subsystem portion that process the data may also be referred to as a consumer of the data.

The subsystem 314A (and decoder 310) may receive the encoded data through not only the off-chip interconnect 306 but further through an on-chip data interconnect 316. The on-chip data interconnect 316 may be coupled to a memory controller 312 that controls the flow of data to and from the memory system 304.

As the memory system 304 provides the data across a data interconnect in this embodiment (FIG. 3), the memory system 304 may be referred to as a data source component. As the SoC 302 receives data from a data interconnect in this embodiment, the SoC 202 may be referred to as a data destination component. The subsystem 314A may also be referred to as a data destination component, as it receives data via data interconnects. In other embodiments (not shown in FIG. 3) still other types of components may serve as such data source and destination components. Also, although in the system 300 the decoder 310 is included in the subsystem 314A, in other embodiments such a decoder may be included in any other component. It may be appreciated from the foregoing descriptions of the embodiments illustrated in FIGS. 2 and 3 that the decoder may be included anywhere in the data path between a data interconnect and a component or portion thereof configured to process or consume the (decoded) data.

Figure 4A:
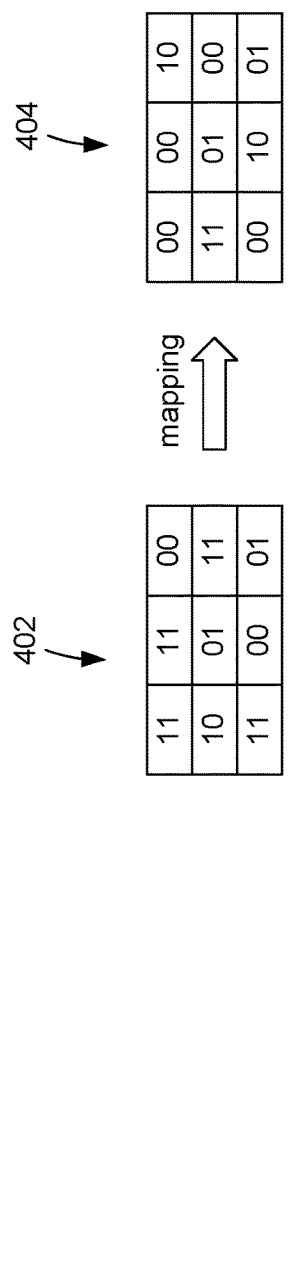
FIG. 4A is a data diagram illustrating an example of mapping or encoding data using minimum Hamming weight encoding, in accordance with exemplary embodiments.

As illustrated in FIG. 4A, original (i.e., non-encoded) data 402 may be encoded by mapping data values that occur more frequently to codewords having fewer "1"s and mapping data values that occur less frequently to codewords having more "1"s. In the illustrated example, the original data 402 consists of: four "11" data values; one "10" data value; two "01" data values; and two "00" data values. The original data 402 is depicted organized in a matrix or two-dimensional array as an example, but the original data 402 may be organized in any manner. In the illustrated example, the original data 402 is transformed or encoded into encoded data 404 by performing the following mapping.

As the most frequently occurring data value in the original data 402 is "11" (which occurs four times), the data value of "11" in the original data 402 is mapped to the codeword or encoded data value having the fewest "1"s, which is "00". Accordingly, each data value of "11" in the original data 402 is mapped to the codeword "00" in the encoded data 404.

As the next-most frequently occurring data values in the original data 402 are "01 and "00" (each of which occurs two times), either of those data values may be mapped to a codeword or encoded data value having the next-fewest "1"s, which is either of "10" and "01". Accordingly, in the illustrated example each data value of "00" in the original data 402 is mapped to the codeword "10" in the encoded data 404, and each data value of "01" in the original data 402 is mapped to the codeword "01" in the encoded data 404. Alternatively, each data value of "00" in the original data 402 could be mapped to the codeword "01" in the encoded data 404, and each data value of "01" in the original data 402 could be mapped to the codeword "10" in the encoded data 404.

As the next-most frequently occurring data value in the original data 402 is "10" (which occurs one time and is the least frequently occurring data value), the data value of "10" in the original data 402 is mapped to the codeword or encoded data value having the next-fewest "1"s, which is "00". Accordingly, the data value of "10" in the original data 402 is mapped to the codeword "00" in the encoded data 404.

Figure 4B:
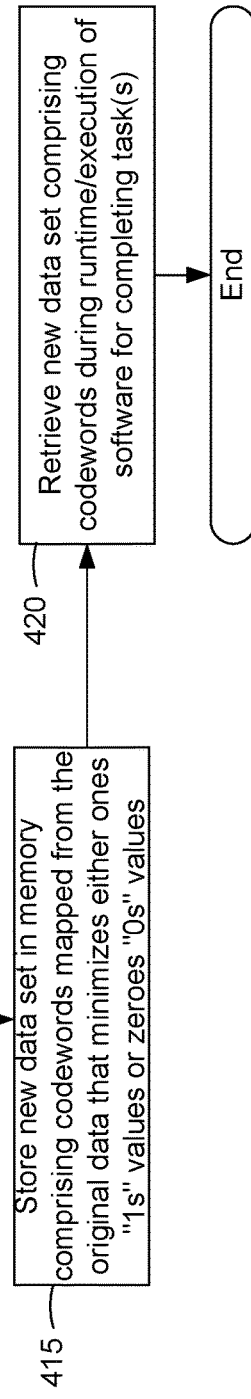
FIG. 4B illustrates a logical flowchart of a method corresponding to FIG. 4A for encoding data to help reduce termination power.

Referring now to FIG. 4B, this figure illustrates a logical flowchart of a method 400 for encoding data to help reduce termination power. This method 400 may be performed/executed by a memory controller that comprises an encoder. Block 405 is the first block of method 400. In block 405, prior to runtime/execution/storage of original data 402, such as illustrated in FIG. 4A, the original data 402 is inspected to determine a frequency of each of the plurality of data values. Next, in block 410, based on a frequency of each data value, each data value is mapped to a codeword that minimizes either ones "1s" values or zeroes "0s" values, where each codeword may help reduce termination power. Specifically, as described above in connection with FIG. 4A, the encoding chosen is based on the memory interface, such as a DDR memory interface.

According to one example, "minimum Hamming weight encoding" may be used in block 410 that reduces the number of ones "1"s in the original data 402. According to another example (not illustrated in FIG. 4A), "maximum Hamming weight encoding" may be used in block 410 that reduces the number of zeroes "0"s in the original data 402. The Hamming weight encoding is chosen based on the DDR interface and one which will help reduce termination power as described above.

Next, in block 415, the new data set comprising the codewords mapped from the original data based on the chosen Hamming weight encoding is stored in memory, where the encoding minimizes either ones "1s" values or zeroes "0s" values. Subsequently, in bock 420, the new data set comprising the codewords may be retrieved during runtime/execution of software for completing one or more tasks. The method 400 may then end.

As understood by one of ordinary skill in the art, the term "Hamming weight" may be used to describe the number of "1"s in a data value. More specifically, "Hamming weight" may be defined as the number of bits in a data value that are set equal to one.

In accordance with the example illustrated in FIG. 4A, it may be appreciated that the encoding maps the data value that occurs most frequently to the codeword or encoded data value having the fewest "1"s or lowest Hamming weight, maps the data value that occurs least frequently to the codeword or encoded data value having the most "1"s or highest Hamming weight, and maps data values having other frequencies of "1"s to similarly correspondingly Hamming-weighted codewords. The term "minimum Hamming weight encoding" may be used herein to refer to this coding or mapping. That is, "minimum Hamming weight encoding" refers to an encoding method that reduces the number of "1"s.

However, as noted previously, in certain DRAM standards (e.g., DDR4), it is the bits that are set to a zero "0" value as opposed to those set to one "1" values that consume significant energy. Thus, the present disclosure is not limited to minimizing the use or setting of one "1" values. The present disclosure covers whichever bit consumes the most energy for memory in a portable computing device as understood by one of ordinary skill in the art.

That is, depending on the type of DDR interface (e.g., DDR4 vs. LPDDR5), it may be either the ones "1s" values or the zeroes "0s" values that may consume termination power. Therefore, this disclosure is not limited to "minimum Hamming weight encoding." The disclosure may also cover "maximizing Hamming weight encoding" if minimizing the number of zeroes "0s" may reduce termination power based on the type of DDR interface being employed.

The minimum Hamming weight encoding may occur at any time. For example, some types of data are static, i.e., do not change values during runtime. Such static data may be stored in a memory or other data source component before runtime or otherwise before the data is requested by a subsystem for processing, such as described in the method 400 of FIG. 4B. In accordance with the present disclosure, such static data may be minimum Hamming weight-encoded before it is stored in memory, such as in the above-described memory system 204 (FIG. 2) or 304 (FIG. 3).

One example of static data comprises deep neural network weights. Deep neural network weights may be minimum Hamming weight-encoded before they are stored in memory and/or before runtime. Specifically, prior to runtime or prior to execution of software which requires certain data to complete a task or function with a hardware device, the data may be statically inspected to determine an optimal encoding of that data based on inspecting a frequency of observed symbols in that data. For example, such data that is encoded may comprise deep neural network weights which may be used by an NPU. Software and/or an NPU may need the deep neural network weights during runtime of certain software.

The encoding of deep neural network weights may occur prior to any runtime or prior to any execution of software that requires the deep neural network weights. During this static inspection (prior to runtime), an optimal encoding of the deep neural network weights may be determined based on an inspection of a frequency of observed symbols in that data.

As noted above, an NPU may frequently issue read requests for weights stored in memory. The weights remain constant or static over the various read requests. Reducing the amount of energy required to fetch the weights may help reduce overall power consumption of the computing device. Another example of static data is static executable code or instructions. Still other examples will occur readily to one of ordinary skill in the art. Nevertheless, embodiments are also contemplated in which the minimum Hamming weight encoding is performed dynamically, i.e., such as during runtime.

Figure 5:
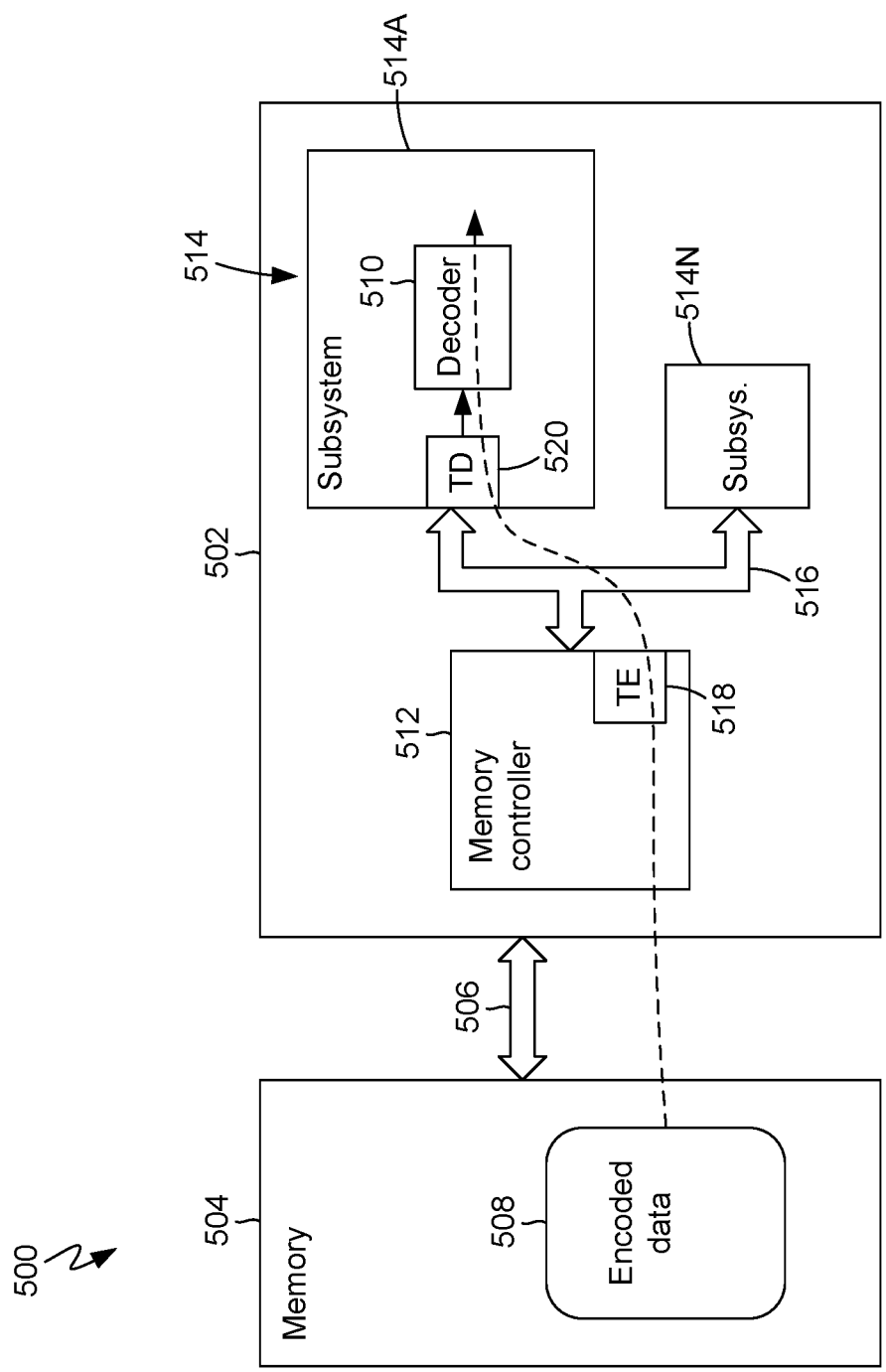
FIG. 5 is a block diagram illustrating another system for transferring data in a computing device, in accordance with exemplary embodiments.

In FIG. 5, a system 500 similar to the above-described system 300 (FIG. 3) is illustrated. The system 500 further includes a transition encoder ("TE") 518 and a transition decoder ("TD") 520. Except for the TE 518 and TD 520, elements of the system 500 may be similar to the above-described elements of the system 300. Accordingly, such elements are not described in similar detail with regard to the system 500. Briefly, these elements include: an SoC 502, a memory system 504 (configured to store encoded data 508), an off-chip data interconnect 506, a decoder 510, a memory controller 512, subsystems 514A through 514N (collectively referred to as the subsystems 514), and an on-chip data interconnect 516. The encoded data 508 (as well as the encoded data 208 (FIG. 2) and 308 (FIG. 3)) may be minimum Hamming weight-encoded as described above with regard to FIG. 4A.

Figure 6:
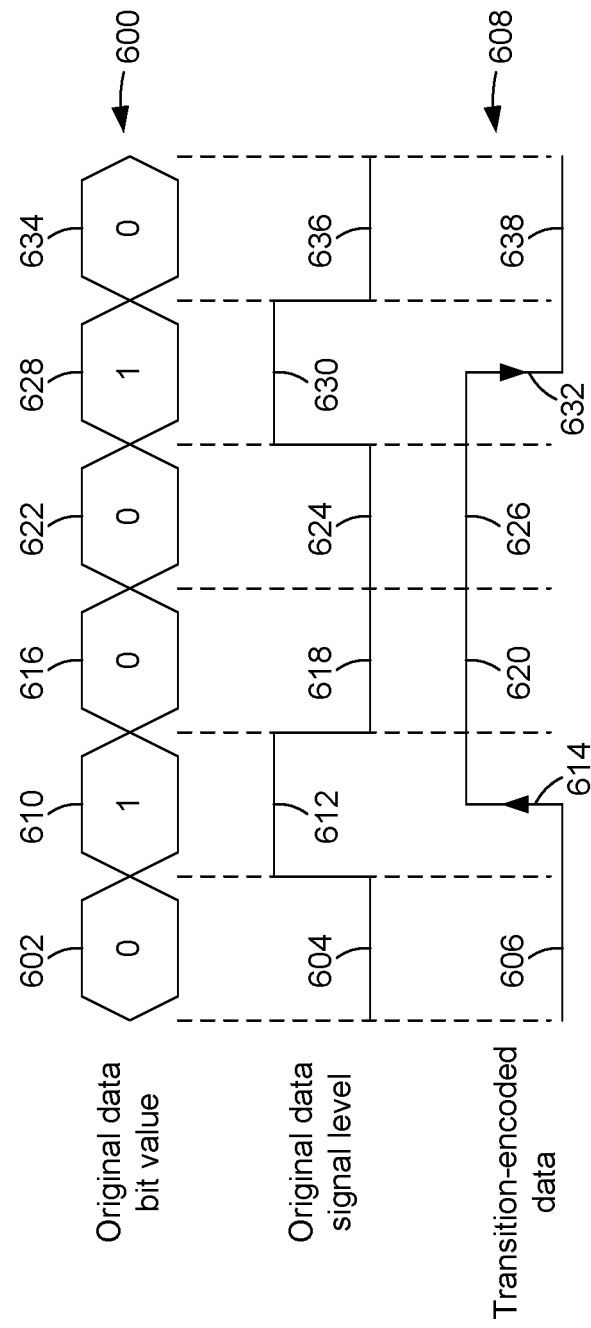
FIG. 6 is a timing diagram illustrating an example of transition encoding, in accordance with exemplary embodiments.

Referring briefly to FIG. 6, as understood by one or ordinary skill in the art, transition encoding (also known as transition signaling) is an encoding method in which each data value of "1" is encoded as a signal level transition, and each data value of "0" is encoded as an absence of a signal level transition. In the example shown in FIG. 6, a first data value 602 of "0" in the original or un-encoded data 600 (represented by a signal level 604 of "0") is encoded as an absence 606 of a signal level transition in the transition-encoded data 608.

A second data value 610 of "1" in the original or unencoded data 600 (represented by a signal level 612 of "1") is encoded as a signal level transition 614 (i.e., a rising edge or transition from "0" to "1") in the transition-encoded data 608. A third data value 616 of "0" in the original or un-encoded data 600 (represented by a signal level 618 of "0") is encoded as an absence 620 of a signal level transition in the transition-encoded data 608.

A fourth data value 622 of "0" in the original or un-encoded data 600 (represented by a signal level 624 of "0") is encoded as an absence 626 of a signal level transition in the transition-encoded data 608. A fifth data value 628 of "1" in the original or un-encoded data 600 (represented by a signal level 630 of "1") is encoded as a signal level transition 632 (i.e., a falling edge or transition from "1" to "0") in the transition-encoded data 608. A sixth data value 634 of "0" in the original or un-encoded data 600 (represented by a signal level 636 of "0") is encoded as an absence 638 of a signal level transition in the transition-encoded data 608. From the foregoing example, it may be appreciated that transition encoding may be employed to reduce the number of signal level transitions.

Figure 7:
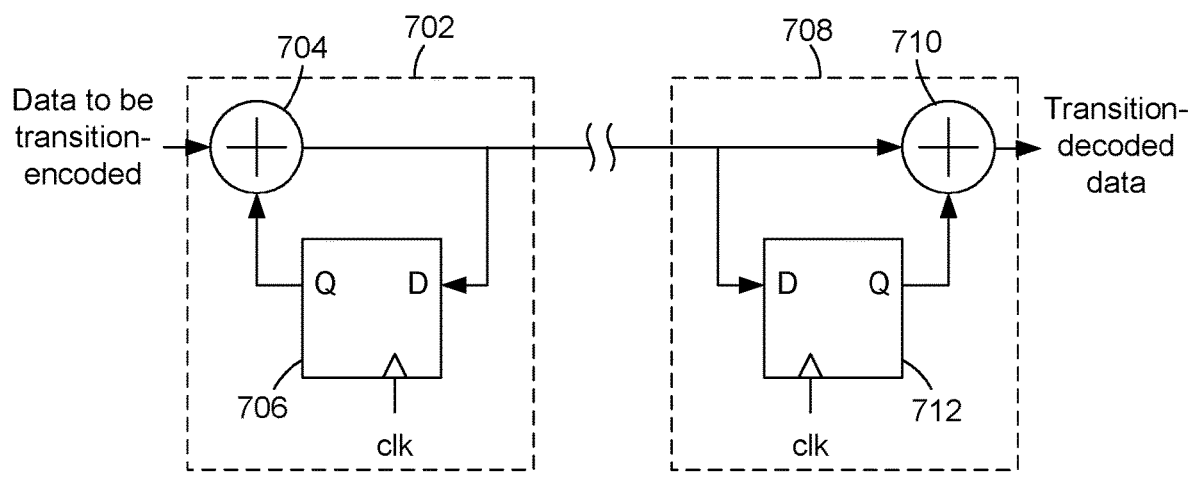
FIG. 7 is a block diagram illustrating transition-encoding and transition-decoding circuit logic.

Referring briefly to FIG. 7, as understood by one or ordinary skill in the art, an exemplary TE 702 may comprise a two-input exclusive-OR ("XOR") gate 704 and a flip-flop 706. One input of the XOR gate 704 is configured to receive data to be transition encoded. The other input of the XOR gate 704 is configured to receive the output of the flip-flop 706. The input of the flip-flop 706 is configured to receive the output of the XOR gate 704 and thereby feed back to the XOR gate 704 the output of the XOR operation on every clock cycle. The output of the XOR gate 704 provides transition-encoded data.

Inversely, an exemplary TD 708 may comprise a two-input XOR gate 710 and a flip-flop 712. One input of the XOR gate 710 is configured to receive the transition-encoded data. The other input of the XOR gate 710 is configured to receive the output of the flip-flop 712. The output of the XOR gate 710 provides the transition-decoded data. The input of the flip-flop 712 is configured to receive the transition-encoded data and thereby feed forward to the XOR gate 710 the value of the transition-encoded data on the previous clock cycle.

Referring again to FIG. 5, the TE 518 and TE 520 may have configurations similar to those of the above-described TE 702 and TD 708 (FIG. 7), respectively. The TE 518 may be configured to transition-encode the minimum Hamming weight-encoded data that the SoC 502 receives through the off-chip data interconnect 506. The TE 518 may be configured to provide the resulting transition-encoded data to the first subsystem 514A over the on-chip data interconnect 516. The TD 520 may be configured to receive the transition-encoded data over the on-chip data interconnect 516 and to transition-decode the received transition-encoded data. The decoder 510 may be configured to perform minimum Hamming weight decoding on the transition-decoded data provided by the TD 520.

Figure 8:
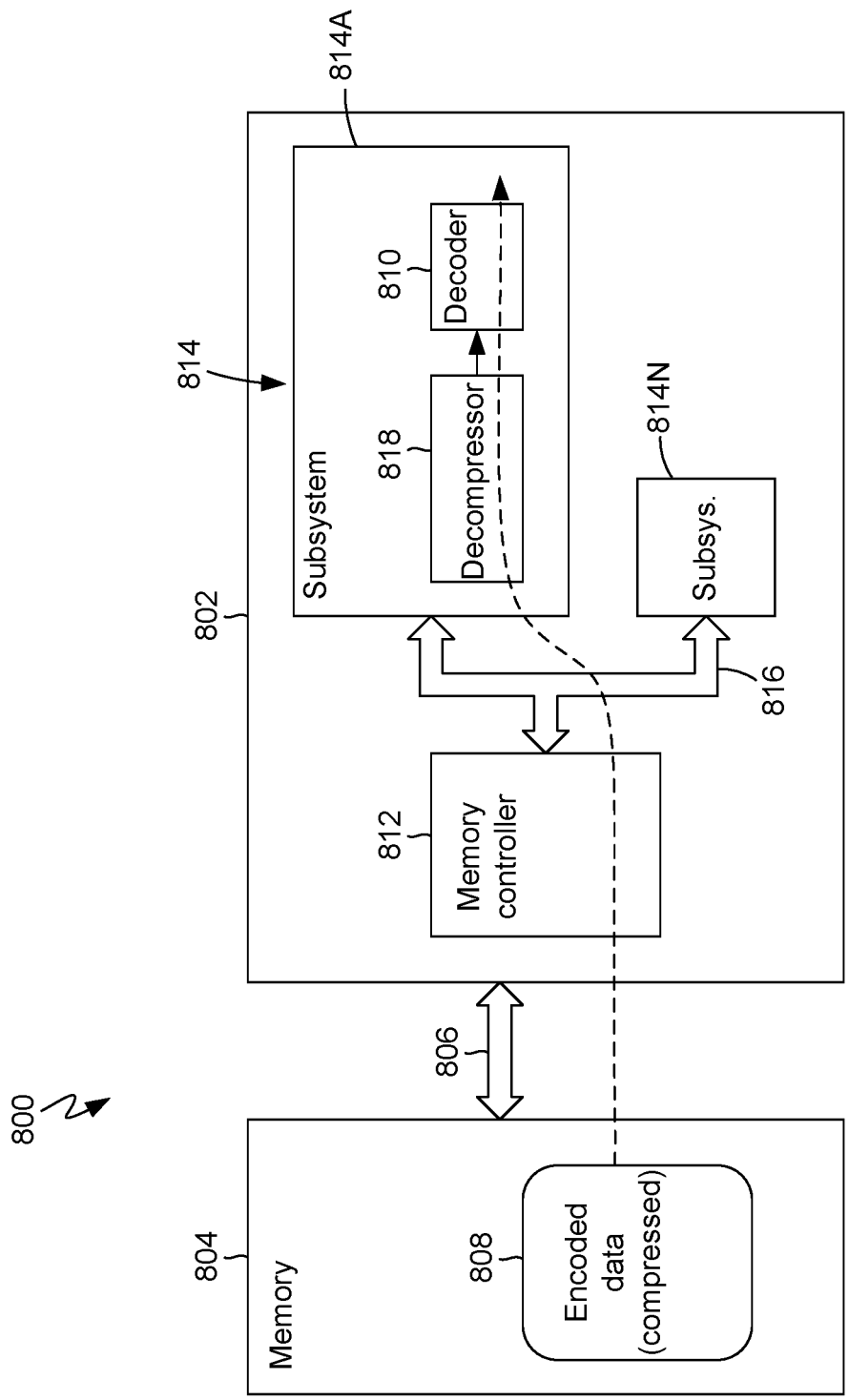
FIG. 8 is a block diagram illustrating still another system for transferring data in a computing device, in accordance with exemplary embodiments.

In FIG. 8, a system 800 similar to the above-described system 300 (FIG. 3) is illustrated. The system 800 further includes a decompressor 818. Although the decompressor 818 may be of any type (i.e., employ any decompression method), in the exemplary embodiment an algorithm described below may be employed. Except for the decompressor 818, elements of the system 800 are similar to the above-described elements of the system 300.

Accordingly, such elements are not described in similar detail with regard to the system 800. Briefly, these elements include: an SoC 802, a memory system 804 (configured to store encoded data 808), an off-chip data interconnect 806, a decoder 810, a memory controller 812, subsystems 814A through 814N (collectively referred to as the subsystems 814), and an on-chip data interconnect 816.

Figure 9:
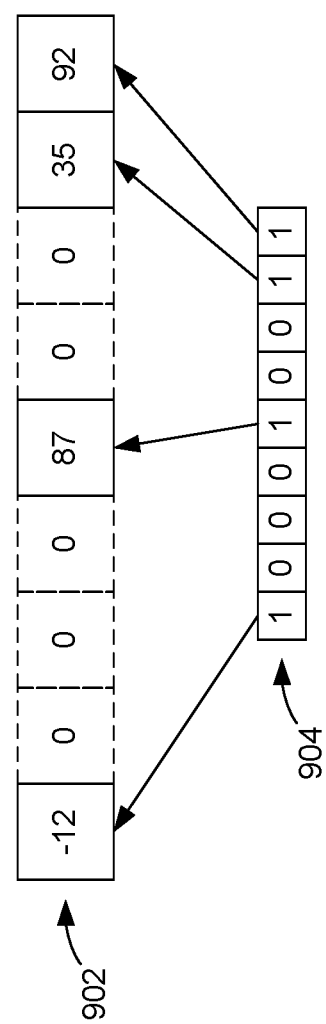
FIG. 9 is a data diagram illustrating an example of a type of data compression.

Referring briefly to FIG. 9, an exemplary compression (and inversely, decompression) method may be based on reducing the number of data words having a value of "0". More particularly, in this exemplary method only the non-zero data words are minimum Hamming weight-encoded; data words having a value of "0" are not minimum Hamming weight-encoded. In the example shown in FIG. 9, nine exemplary data words 902 are shown in decimal notation. Of the nine data words 902 in this example, five have values of "0". The non-zero data words 902 in this example have values of −12, 87, 35 and 92. The data words 902 are depicted organized in a list or one-dimensional array as an example, but such data words may be organized in any manner. A list of presence bits 904 may be maintained along with the data words 902. Each presence bit 904 corresponds to one data word 902.

A presence bit 904 having a value of "1" identifies a corresponding data word 902 having a non-zero value, while a presence bit 904 having a value of "0" identifies a corresponding data word 902 having a zero value. The data words 902 having zero values are not stored in memory or otherwise provided by a data source component via a data interconnect. For example, in an embodiment in which each data word 902 represents a neural network weight, each non-zero data word 902 may be represented by eight stored bits and may be identified by one stored presence bit 904.

Referring again to FIG. 8, the encoded data 808 may be compressed in the manner described above with regard to FIG. 9. That is, the encoded data 808 stored in the memory system 804 consists of only minimum Hamming weight-encoded data words having non-zero values and presence bits (not shown in FIG. 8). The decompressor 818 may be configured to decompress the minimum Hamming weight-encoded data that the SoC 802 receives through the off-chip data interconnect 806 and the on-chip data interconnect 816. The decompressor 818 may be configured to receive the compressed data and decompress it. In the exemplary embodiment, decompression by the decompressor 818 means that the zero and non-zero data words (e.g., in an array of 8-bit neural network weights) are identified, and zero data words (e.g., eight bits) are reconstituted. The decoder 810 may be configured to perform minimum Hamming weight decoding as described above on the decompressed data provided by the decompressor 818.

Figure 10:
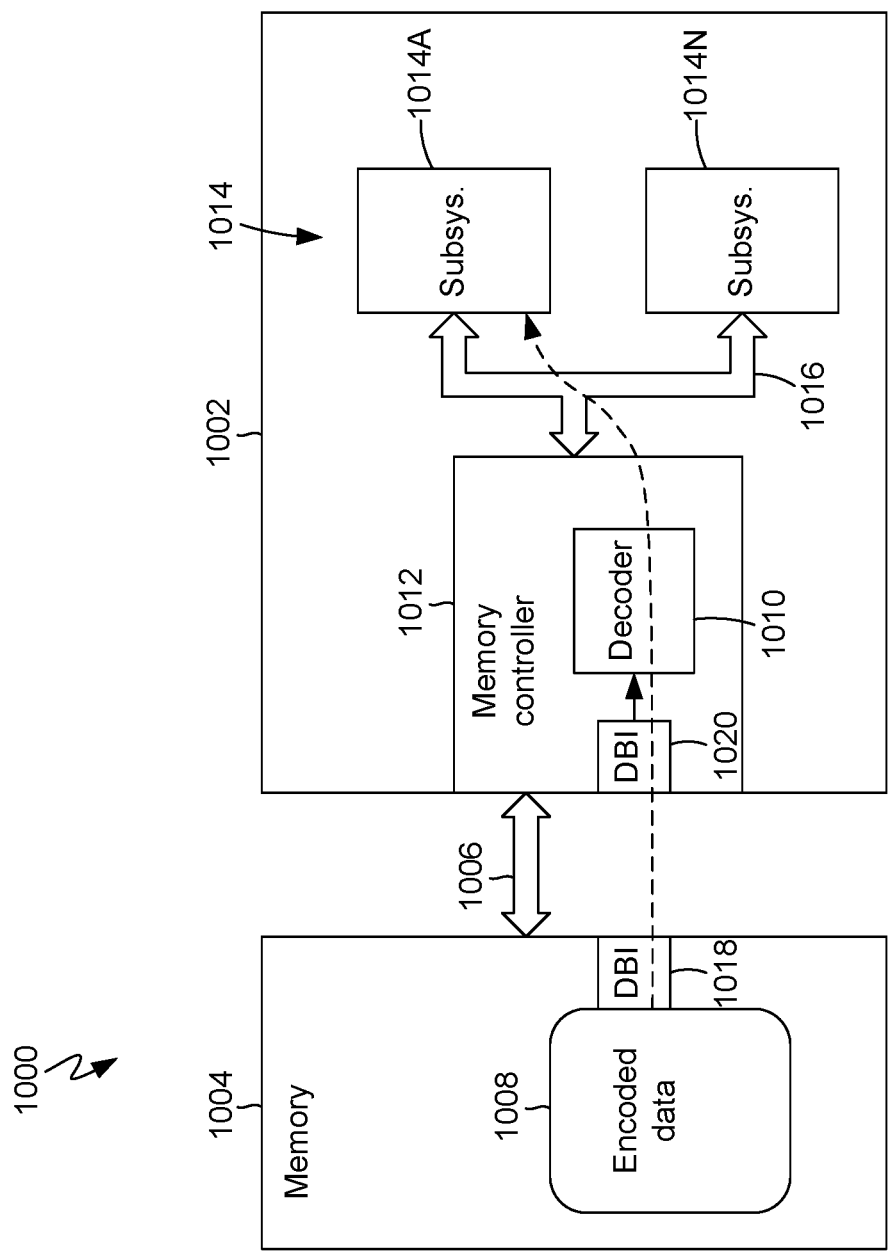
FIG. 10 is a block diagram illustrating yet another system for transferring data in a computing device, in accordance with exemplary embodiments.

In FIG. 10, a system 1000 similar to the above-described system 200 (FIG. 32) is illustrated. The system 1000 further includes a data bus inversion ("DBI") encoder 1018 and a DBI decoder 1020. Except for the DBI encoder 1018 and DBI decoder 1020, elements of the system 1000 are similar to the above-described elements of the system 200. Accordingly, such elements are not described in similar detail with regard to the system 1000. Briefly, these elements include: an SoC 1002, a memory system 1004 (configured to store encoded data 1008), an off-chip data interconnect 1006, a decoder 1010, a memory controller 1012, subsystems 1014A through 1014N (collectively referred to as the subsystems 1014), and an on-chip data interconnect 1016.

Figure 11:
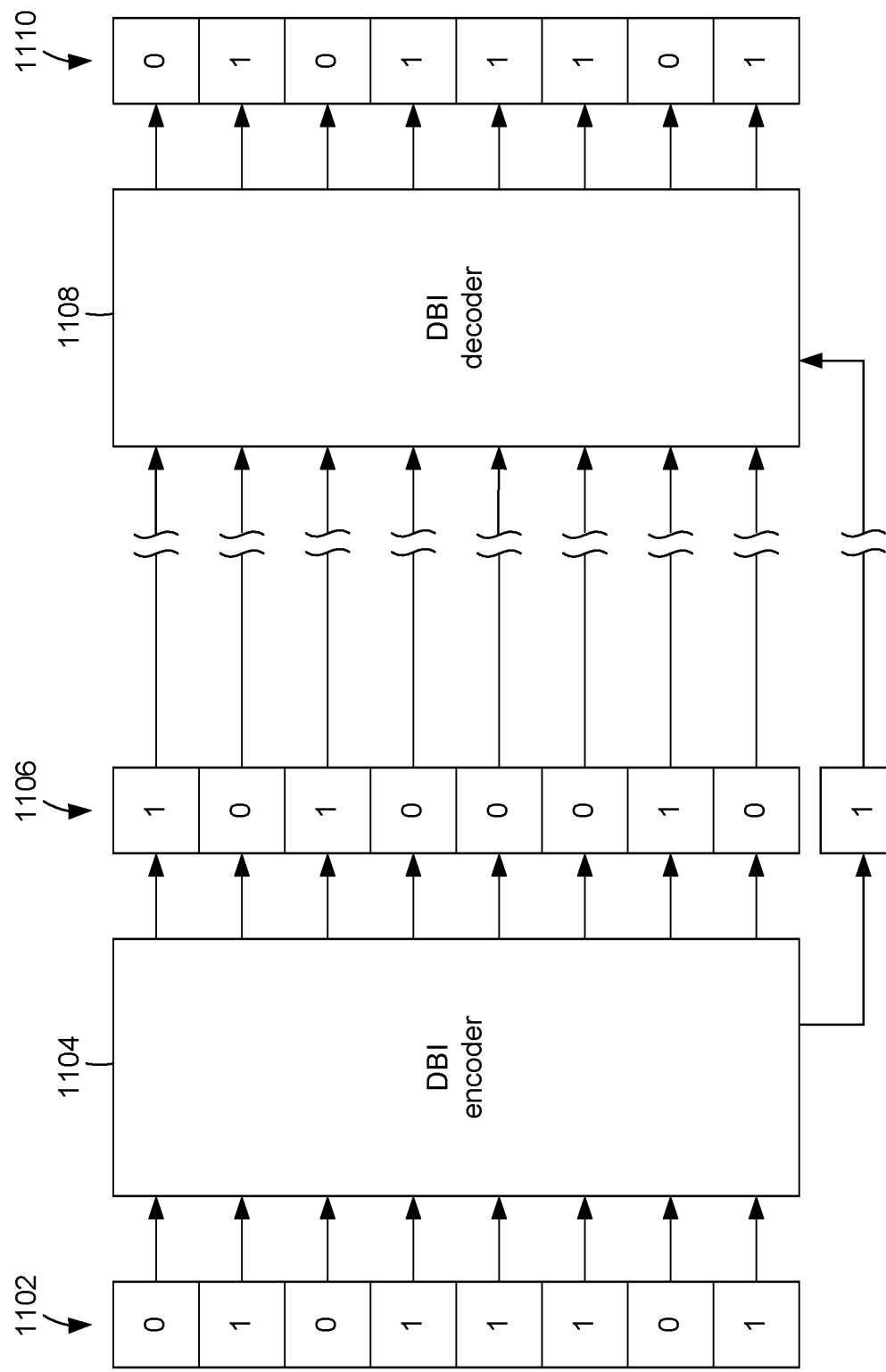
FIG. 11 is a block diagram illustrating an example of data bus inversion ("DBI"), in accordance with exemplary embodiments.

Referring briefly to FIG. 11, as understood by one or ordinary skill in the art, DBI is an encoding method in which all bits of the original data word are inverted if more than a threshold number of bits of the original data word have a value of "1 while no bits of the original data word are inverted if fewer than the threshold number of bits of the original data word have a value of "1". An original data word 1102 is provided or input to a DBI encoder 1104, which applies DBI encoding in the above-described manner, inverting or not inverting the bits depending on how many bits have a value of "1". The output of the DBI encoder 1104 comprises a DBI-encoded data word 1106 and a DBI flag bit 1107 that indicates whether the DBI-encoded data word 1106 consists of inverted bits. The DBI-encoded data word 1106 and the DBI flag bit 1107 may be provided or input to a DBI decoder 1108, which applies DBI decoding to produce a DBI-decoded data word 1110, i.e., a replica of the original data word 1102. That is, in an instance in which the DBI flag bit 1107 has a value of "1" the DBI decoder 1108 re-inverts all bits of the DBI-encoded data word 1106, while in an instance in which the DBI flag bit 1107 has a value of "0" the DBI decoder 1108 does not re-invert any bits of the DBI-encoded data word 1106.

In the example shown in FIG. 11, an original data word 1102 consists of five bits having a value of "1" and three bits having a value of "0". In the exemplary embodiment, the above-described threshold may be, for example, three bits. In this example the DBI encoder 1104 inverts all bits of the original data word 1102 because more than three bits have a value of "1" and produces a DBI flag bit 1107 having a value of "1" to indicate that the inversion occurred.

Referring again to FIG. 10, the DBI encoder 1018 may be configured to DBI-encode the (minimum Hamming weight-encoded) data 1008 before providing the data to the SoC 1002 over the off-chip data interconnect 1006. The data that the SoC 1002 receives over the off-chip data interconnect 1006 is thus both minimum Hamming weight-encoded and DBI-encoded in the embodiment illustrated in FIG. 10. The DBI decoder 1020, which may be included in the memory controller 1012 in this embodiment, may be configured to DBI-decode the data that the SoC 1002 receives over the off-chip data interconnect 1006.

The decoder 1010, which may also be included in the memory controller 1012 in this embodiment, may be configured to perform minimum Hamming weight decoding as described above with regard to other embodiments. Although in the embodiment illustrated in FIG. 10 the decoder 1010 is included in the memory controller 1012, in other embodiments such a decoder may be included in another component or subsystem.

Figure 12:
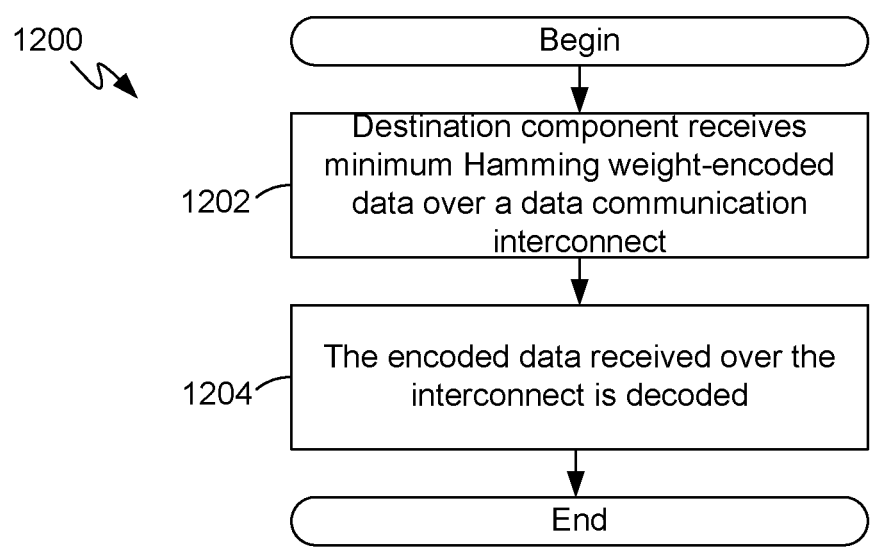
FIG. 12 is a flow diagram illustrating a method for transferring data in a computing device, in accordance with exemplary embodiments.

As illustrated in FIG. 12, an exemplary method 1200 for transferring data in a computing device may include the following. As indicated by block 1202, the method 1200 may include a destination component receiving minimum Hamming weight-encoded data from a source component over a data communication interconnect. As indicated by block 1204, the method 1200 may further include the destination component decoding the received data using minimum Hamming weight decoding. The first data communication interconnect may be, for example, a terminated interconnect, such as an off-chip interconnect.

Figure 13:
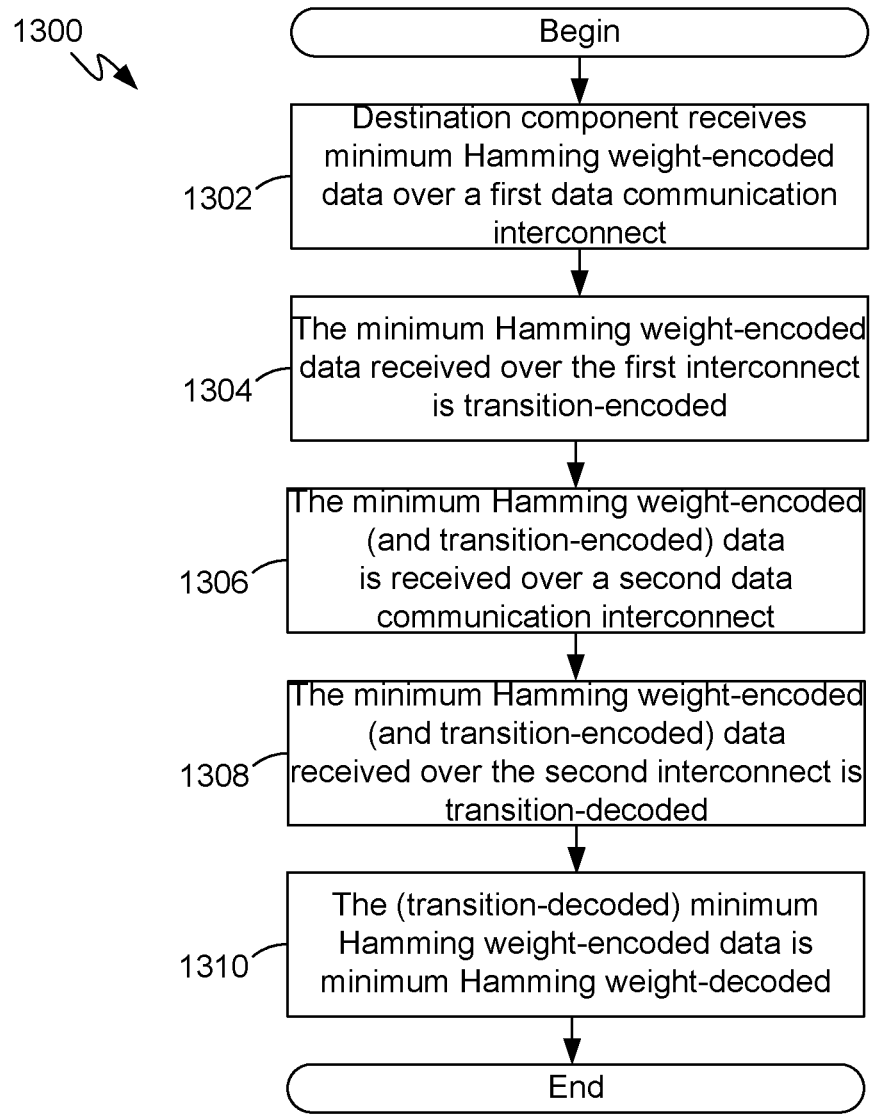
FIG. 13 is a flow diagram illustrating a further method for transferring data in a computing device, in accordance with exemplary embodiments.

As illustrated in FIG. 13, an exemplary method 1300 for transferring data in a computing device may include the following. As indicated by block 1302, the method 1300 may include a destination component receiving minimum Hamming weight-encoded data from a source component over a first data communication interconnect. The first data communication interconnect may be, for example, a terminated interconnect, such as an off-chip interconnect. As indicated by block 1304, the method 1300 may also include transition-encoding the received (minimum Hamming weight-encoded) data. As indicated by block 1306, the method 1300 may further include receiving the minimum Hamming weight-encoded (and transition-encoded) data over a second data communication interconnect. The second data communication interconnect may be, for example, an unterminated interconnect, such as an on-chip interconnect. As indicated by block 1308, the method 1300 may still further include transition-decoding the received (minimum Hamming weight-encoded) data. As indicated by block 1310, the method 1300 may include the decoding the received (now-transition-decoded) data using minimum Hamming weight decoding.

Figure 14:
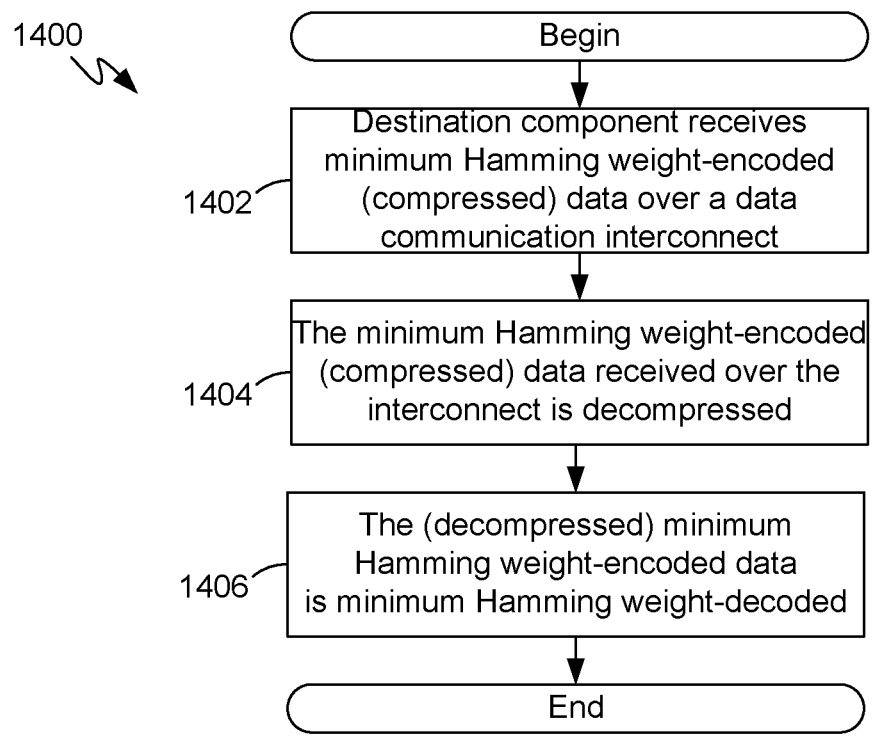
FIG. 14 is a flow diagram illustrating another method for transferring data in a computing device, in accordance with exemplary embodiments.

As illustrated in FIG. 14, an exemplary method 1400 for transferring data in a computing device may include the following. As indicated by block 1402, the method 1400 may include a destination component receiving compressed, minimum Hamming weight-encoded data from a source component over a data communication interconnect. As indicated by block 1404, the method 1400 may further include decompressing the received (minimum Hamming weight-encoded) data. As indicated by block 1406, the method 1400 may include the decoding the received (now-decompressed) data using minimum Hamming weight decoding.

Figure 15:
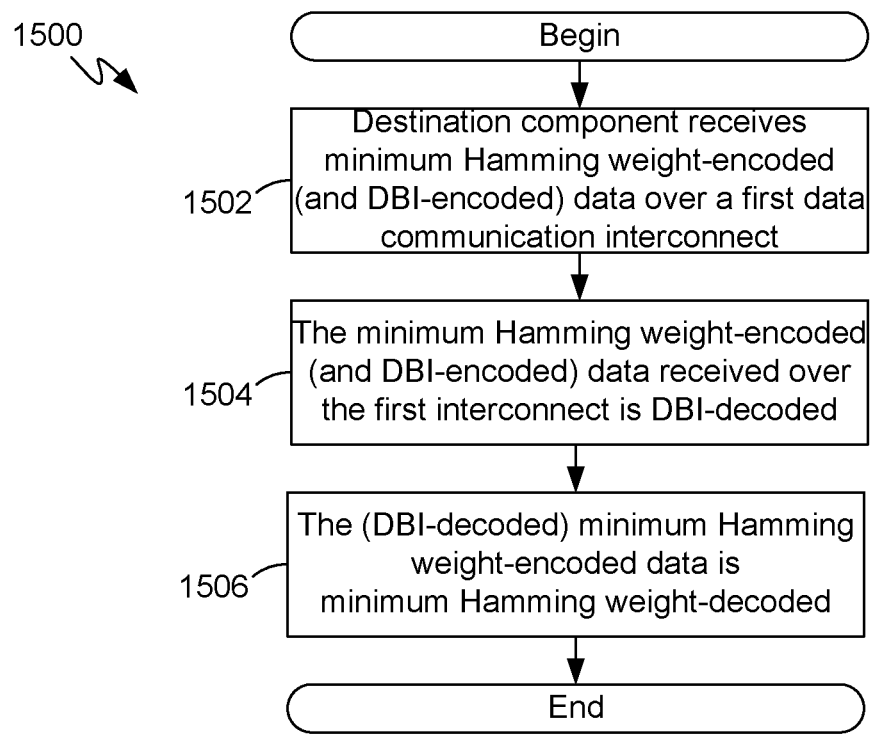
FIG. 15 is a flow diagram illustrating yet another method for transferring data in a computing device, in accordance with exemplary embodiments.

As illustrated in FIG. 15, an exemplary method 1500 for transferring data in a computing device may include the following. As indicated by block 1502, the method 1400 may include a destination component receiving minimum Hamming weight-encoded, DBI-encoded data from a source component over a data communication interconnect. As indicated by block 1504, the method 1500 may further include DBI-decoding the received (minimum Hamming weight-encoded) data. As indicated by block 1506, the method 1500 may include the decoding the received (now-DBI-decoded) data using minimum Hamming weight decoding.

It should be understood that various aspects of the methods 1200 (FIG. 12), 1300 (FIG. 13), 1400 (FIG. 14) and 1500 (FIG. 15) may be combined in various ways to provide still further methods for transferring data in a computing device. For example, a method could include any combination of decompression, transition coding and DBI coding.

Figure 16:
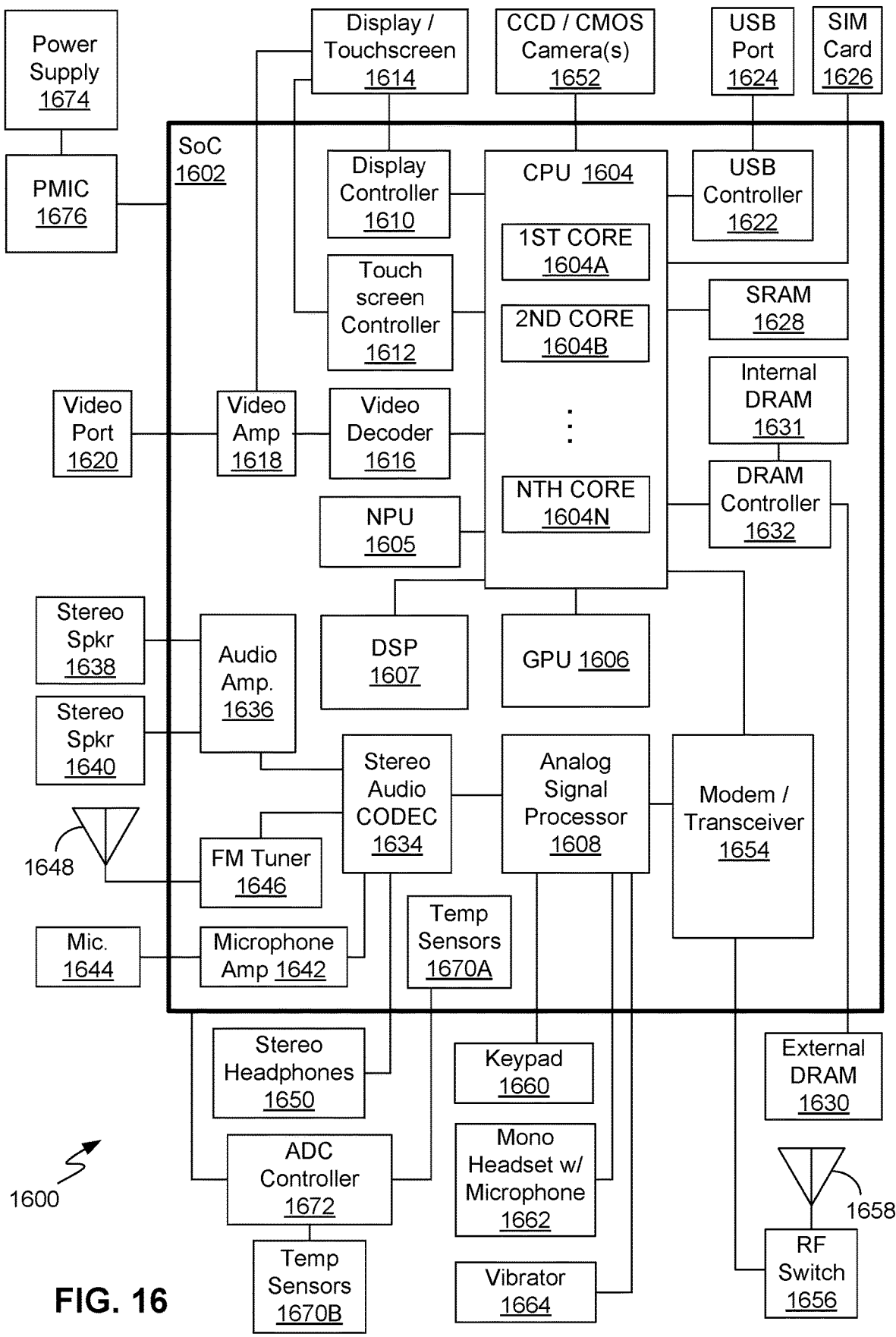
FIG. 16 is block diagram of a portable computing device, in accordance with exemplary embodiments.

In FIG. 16, an example of a PCD 1600, such as a mobile phone, in which exemplary embodiments of systems, methods, computer-readable media, and other examples of transferring data in a computing device may be provided is illustrated. For purposes of clarity, some data communication interconnects, clock signals, power supply voltages, etc., are not shown in FIG. 16.

The PCD 1600 may include an SoC 1602. The SoC 1602 may include a CPU 1604, an NPU 1605, a GPU 1606, a DSP 1607, an analog signal processor 1608, a modem/modem subsystem 1654, or other processors. The CPU 1604 may include one or more CPU cores, such as a first CPU core 1604A, a second CPU core 1604B, etc., through an Nth CPU core 1604N.

A display controller 1610 and a touch-screen controller 1612 may be coupled to the CPU 1604. A touchscreen display 1614 external to the SoC 1602 may be coupled to the display controller 1610 and the touch-screen controller 1612. The PCD 1600 may further include a video decoder 1616 coupled to the CPU 1604. A video amplifier 1618 may be coupled to the video decoder 1616 and the touchscreen display 1614. A video port 1620 may be coupled to the video amplifier 1618. A universal serial bus ("USB") controller 1622 may also be coupled to CPU 1604, and a USB port 1624 may be coupled to the USB controller 1622. A subscriber identity module ("SIM") card 1626 may also be coupled to the CPU 1604.

One or more memories may be coupled to the CPU 1604. The one or more memories may include both volatile and non-volatile memories. Examples of volatile memories include static random access memory ("SRAM") 1628 and DRAM 1630 and 1631. Such memories may be external to the SoC 1602, such as the DRAM 1630, or internal to the SoC 1602, such as the DRAM 1631. A DRAM controller 1632 coupled to the CPU 1604 may control the writing of data to, and reading of data from, the DRAMs 1630 and 1631. The DRAM controller 1632 may be an example of any of the above-described memory controllers 212 (FIG. 2), 312 (FIG. 4A), 512 (FIG. 5), 812 (FIG. 8) or 1012 (FIG. 10). The DRAMs 1630 and 1631, SRAM 1628 or other memories (not shown) of the PCD 1600 may be an example of any of the above-described memory systems 204 (FIG. 2), 304 (FIG. 3), 504 (FIG. 5), 804 (FIG. 8) or 1004 (FIG. 10).

A stereo audio CODEC 1634 may be coupled to the analog signal processor 1608. Further, an audio amplifier 1636 may be coupled to the stereo audio CODEC 1634. First and second stereo speakers 1638 and 1640, respectively, may be coupled to the audio amplifier 1636. In addition, a microphone amplifier 1642 may be coupled to the stereo audio CODEC 1634, and a microphone 1644 may be coupled to the microphone amplifier 1642. A frequency modulation ("FM") radio tuner 1646 may be coupled to the stereo audio CODEC 1634. An FM antenna 1648 may be coupled to the FM radio tuner 1646. Further, stereo headphones 1650 may be coupled to the stereo audio CODEC 1634. Other devices that may be coupled to the CPU 1604 include one or more digital (e.g., CCD or CMOS) cameras 1652.

A modem or RF transceiver 1654 may be coupled to the analog signal processor 1608 and the CPU 1604. It is noted that the modem or RF transceiver 1654 may have its own plurality of processors and/or cores similar to the CPU 1604 and NPU 1605 mentioned above. The modem or RF transceiver 1654 may comprise its own "subsystem," like CPU 1604, which has a plurality of processors as understood by one of ordinary skill in the art.

An RF switch 1656 may be coupled to the RF transceiver 1654 and an RF antenna 1658. In addition, a keypad 1660, a mono headset with a microphone 1662, and a vibrator device 1664 may be coupled to the analog signal processor 1608.

The SoC 1602 may have one or more internal or on-chip thermal sensors 1670A and may be coupled to one or more external or off-chip thermal sensors 1670B. An analog-to-digital converter ("ADC") controller 1672 may convert voltage drops produced by the thermal sensors 1670A and 1670B to digital signals. A power supply 1674 and a PMIC 1676 may supply power to the SoC 1602.

The PCD 1600 is only one example of a device or system in which exemplary embodiments of systems, methods, computer-readable media, and other embodiments of transferring data over one or more data communication interconnects may be provided. Other examples may include other types of computing devices or computing systems, such as those used in datacenter, automotive, IoT and other contexts.

Firmware or software may be stored in any of the above-described memories, such as DRAM 1630 or 1631, SRAM 1628, etc., or may be stored in a local memory directly accessible by the processor hardware on which the software or firmware executes. Execution of such firmware or software may control aspects of any of the above-described methods or configure aspects any of the above-described systems. Any such memory or other non-transitory storage medium having firmware or software stored therein in computer-readable form for execution by processor hardware may be an example of a "computer-readable medium," as the term is understood in the patent lexicon.

Implementation Examples are Described in the Following Numbered Clauses

1. A method for transferring data in a computing device, comprising: receiving, by a data destination component of the computing device, encoded data from a data source component of the computing device over a first data communication interconnect, the encoded data comprising Hamming weight-encoded data; and decoding the encoded data received over the first data communication interconnect into decoded data.

2. The method of clause 1, wherein the Hamming weight-encoded data comprises a minimum Hamming weight encoding where data is encoded to have fewer one "1" values.

3. The method of clause 1, wherein the Hamming weight-encoded data comprises a maximum Hamming weight encoding where data is encoded to have fewer zero "0" values.

4. The method of clauses 1-3, wherein the data source component comprises a memory chip, the data destination component comprises a system-on-a-chip (SoC), and the first data communication interconnect comprises an inter-chip interconnect.

5. The method of clauses 1-4, wherein the decoding comprises decoding by a memory controller.

6. The method of clauses 1-5, further comprising providing the encoded data to a processor subsystem of the computing device, and wherein the decoding comprises decoding by the processor subsystem.

7. The method of clauses 1-5, further comprising: transition-encoding the encoded data into transition-encoded data; receiving the transition-encoded data over a second data communication interconnect; and transition-decoding the encoded data received over the second data communication interconnect.

8. The method of clauses 1-7, wherein the encoded data comprises compressed data, and further comprising decompressing the encoded data before the decoding of the encoded data.

9. The method of clause 8, wherein the compressed data consists of non-zero data and presence bits, the presence bits identifying the non-zero data in the data source component.

10. The method of clauses 1-9, wherein the encoded data comprises data bus-inverted (DBI) data, and further comprising de-inverting the DBI data before the decoding of the encoded data.

11. The method of clauses 1-10, further comprising creating the encoded data prior to any runtime of software which needs the encoded data to complete a task.

12. The method of clause 11, wherein creating the encoded data comprises determining encoding based on inspecting a frequency of observed symbols in data.

13. The method of clause 12, further comprising mapping original data to codewords based on a selected Hamming-weight code that reduces termination power.

14. A system for transferring data in a computing device, comprising: a data source component; and a data destination component configured to receive encoded data from the data source component over a first data communication interconnect, the encoded data comprising Hamming weight-encoded data, the data destination component further configured to decode the encoded data received over the first data communication interconnect into decoded data.

15. The system of clause 14, wherein the Hamming weight-encoded data comprises a minimum Hamming weight encoding where data is encoded to have fewer one "1" values.

16. The system of clause 14, wherein the Hamming weight-encoded data comprises a maximum Hamming weight encoding where data is encoded to have fewer zero "0" values.

17. The system of clauses 14-16, wherein the data source component comprises a memory chip, the data destination component comprises a system-on-a-chip (SoC), and the first data communication interconnect comprises an inter-chip interconnect.

18. The system of clauses 14-17, wherein the data destination component includes a memory controller configured to control the decoding.

19. The system of clauses 14-18, wherein the data destination component includes a processor subsystem configured to control the decoding.

20. The system of clauses 14-18, further comprising: a transition encoder configured to transition-encode the encoded data into transition-encoded data; a second data communication interconnect in the data destination component; and a transition decoder configured to receive the transition-encoded data over the second data communication interconnect and transition-decode the encoded data before the decoding of the encoded data.

21. The system of clauses 14-20, wherein the encoded data comprises compressed data, and the data destination component further includes a decompressor configured to decompress the encoded data before the decoding of the encoded data.

22. The system of clause 21, wherein the compressed data consists of non-zero data and presence bits, the presence bits identifying the non-zero data in the data source component.

23. The system of clauses 14-23, wherein the encoded data comprises data bus-inverted (DBI) data, and the data destination component further includes a DBI decoder configured to de-invert the DBI data before the decoding of the encoded data.

24. The system of clauses 14-23, wherein the computing device is a portable computing device ("PCD") comprising one of: a cellular telephone, a satellite telephone, a laptop computer, a tablet, a navigation device, a smartbook, a personal digital assistant ("PDA"), an Internet-of-Things ("IoT") device, and an automotive computing device.

25. The system of clauses 14-24, wherein the data source component creates the encoded data prior to any runtime of software which needs the encoded data to complete a task.

26. The system of clause 25, wherein the data source component determines encoding based on inspecting a frequency of observed symbols in data.

27. The system of clause 26, wherein the data source component maps original data to codewords based on a selected Hamming-weight code that reduces termination power.

28. A system for transferring data in a computing device, comprising: means for receiving encoded data by a data destination component of the computing device from a data source component of the computing device over a first data communication interconnect, the encoded data comprising Hamming weight-encoded data; and means for decoding the encoded data received over the first data communication interconnect into decoded data.

29. The system of clause 28, wherein the Hamming weight-encoded data comprises minimum Hamming weight encoding where data is encoded to have fewer one "1" values.

30. The system of clause 28, wherein the Hamming weight-encoded data comprises a maximum Hamming weight encoding where data is encoded to have fewer zero "0" values.

31. The system of clauses 28-30, wherein the data source component comprises a memory chip, the data destination component comprises a system-on-a-chip (SoC), and the first data communication interconnect comprises an inter-chip interconnect.

32. The system of clauses 28-31, wherein the means for decoding is included in a memory controller.

33. The system of clauses 28-33, further comprising means for providing the encoded data to a processor subsystem of the computing device, and wherein the means for decoding is included in the processor subsystem.

34. The system of clauses 28-32, further comprising: means for transition-encoding the encoded data into transition-encoded data; means for receiving the transition-encoded data over a second data communication interconnect; and means for transition-decoding the encoded data received over the second data communication interconnect.

35. The system of clauses 28-34, wherein the encoded data comprises compressed data, and further comprising means for decompressing the encoded data before the means for decoding decodes the encoded data.

36. The system of clause 35, wherein the compressed data consists of non-zero data and presence bits, the presence bits identifying the non-zero data in the data source component.

37. The system of clauses 28-36, wherein the encoded data comprises data bus-inverted (DBI) data, and further comprising means for de-inverting the DBI data before the means for decoding decodes the encoded data.

38. The system of clauses 28-37, wherein the data source component creates the encoded data prior to any runtime of software which needs the encoded data to complete a task.

39. The system of clause 38, wherein the data source component determines encoding based on inspecting a frequency of observed symbols in data.

40. The system of clause 39, wherein the data source component maps original data to codewords based on a selected Hamming-weight code that reduces termination power.

41. A computer-readable medium for transferring data in a computing device, the computer-readable medium comprising a non-transitory computer-readable medium having instructions stored thereon in computer-executable form, the instructions when executed by a processing system configuring the processing system to: receive, at a data destination component of the computing device, encoded data from a data source component of the computing device over a first data communication interconnect, the encoded data comprising Hamming weight-encoded data; and decode the encoded data received over the first data communication interconnect into decoded data.

42. The computer-readable medium of clause 41, wherein the Hamming weight-encoded data comprises a minimum Hamming weight encoding where data is encoded to have fewer one "1" values.

43. The computer-readable medium of clause 41, wherein the Hamming weight-encoded data comprises a maximum Hamming weight encoding where data is encoded to have fewer zero "0" values.

44. The computer-readable medium of clauses 41-43, wherein the data source component comprises a memory chip, the data destination component comprises a system-on-a-chip (SoC), and the first data communication interconnect comprises an inter-chip interconnect.

45. The computer-readable medium of clauses 41-44, wherein the processing system comprises a memory controller.

46. The computer-readable medium of clauses 41-45, wherein the instructions further configure the processing system to receive the encoded data under control of a memory controller and to control the decoding.

47. The computer-readable medium of clauses 41-46, wherein the computing device is a portable computing device ("PCD") comprising one of: a cellular telephone, a satellite telephone, a laptop computer, a tablet, a navigation device, a smartbook, a personal digital assistant ("PDA"), an Internet-of-Things ("IoT") device, and an automotive computing device.

48. The computer-readable medium of clauses 41-47, wherein the data source component creates the encoded data prior to any runtime of software which needs the encoded data to complete a task.

49. The computer-readable medium of clause 48, wherein the data source component determines encoding based on inspecting a frequency of observed symbols in data.

50. The computer-readable medium of clause 49, wherein the data source component maps original data to codewords based on a selected Hamming-weight code that reduces termination power.

Alternative embodiments will become apparent to one of ordinary skill in the art to which this disclosure pertains. Therefore, although selected aspects have been illustrated and described in detail, it will be understood that various substitutions and alterations may be made therein.

What is claimed is:

1. A method for transferring data in a computing device, comprising:
   receiving, by a data destination component of the computing device, encoded data from a data source component of the computing device over a first data communication interconnect, the encoded data comprising Hamming weight-encoded data;
   decoding the encoded data received over the first data communication interconnect into decoded data, wherein the encoded data comprises data bus-inverted (DBI) data, and
   de-inverting the DBI data before the decoding of the encoded data.

2. A method for transferring data in a computing device, comprising:
   receiving, by a data destination component of the computing device, encoded data from a data source component of the computing device over a first data communication interconnect, the encoded data comprising Hamming weight-encoded data;
   decoding the encoded data received over the first data communication interconnect into decoded data, wherein the Hamming weight-encoded data comprises a minimum Hamming weight encoding where data is encoded to have fewer one "1" values.

3. A method for transferring data in a computing device, comprising:
   receiving, by a data destination component of the computing device, encoded data from a data source component of the computing device over a first data communication interconnect, the encoded data comprising Hamming weight-encoded data;
   decoding the encoded data received over the first data communication interconnect into decoded data, wherein the Hamming weight-encoded data comprises a maximum Hamming weight encoding where data is encoded to have fewer zero "0" values.

4. The method of claim 1, wherein the data source component comprises a memory chip, the data destination component comprises a system-on-a-chip (SoC), and the first data communication interconnect comprises an inter-chip interconnect.

5. The method of claim 1, wherein the decoding comprises decoding by a memory controller.

6. The method of claim 1, further comprising providing the encoded data to a processor subsystem of the computing device, and wherein the decoding comprises decoding by the processor subsystem.

7. The method of claim 6, further comprising:
   transition-encoding the encoded data into transition-encoded data;
   receiving the transition-encoded data over a second data communication interconnect; and
   transition-decoding the encoded data received over the second data communication interconnect.

8. The method of claim 6, wherein the encoded data comprises compressed data, and further comprising decompressing the encoded data before the decoding of the encoded data.

9. The method of claim 8, wherein the compressed data consists of non-zero data and presence bits, the presence bits identifying the non-zero data in the data source component.

10. A method for transferring data in a computing device, comprising:
    receiving, by a data destination component of the computing device, encoded data from a data source component of the computing device over a first data communication interconnect, the encoded data comprising Hamming weight-encoded data;
    decoding the encoded data received over the first data communication interconnect into decoded data
    creating the encoded data prior to any runtime of software which needs the encoded data to complete a task.

11. The method of claim 10, wherein creating the encoded data comprises determining encoding based on inspecting a frequency of observed symbols in data.

12. The method of claim 11, further comprising mapping original data to codewords based on a selected Hamming-weight code that reduces termination power.

13. A system for transferring data in a computing device, comprising:
    a data source component; and
    a data destination component configured to receive encoded data from the data source component over a first data communication interconnect, the encoded data comprising Hamming weight-encoded data, the data destination component further configured to decode the encoded data received over the first data communication interconnect into decoded data, wherein the data source component creates the encoded data prior to any runtime of software which needs the encoded data to complete a task.

14. A system for transferring data in a computing device, comprising:
- a data source component; and
- a data destination component configured to receive encoded data from the data source component over a first data communication interconnect, the encoded data comprising Hamming weight-encoded data, the data destination component further configured to decode the encoded data received over the first data communication interconnect into decoded data, wherein the Hamming weight-encoded data comprises a minimum Hamming weight encoding where data is encoded to have fewer one "1" values.

15. A system for transferring data in a computing device, comprising:
- a data source component; and
- a data destination component configured to receive encoded data from the data source component over a first data communication interconnect, the encoded data comprising Hamming weight-encoded data, the data destination component further configured to decode the encoded data received over the first data communication interconnect into decoded data, wherein the Hamming weight-encoded data comprises a maximum Hamming weight encoding where data is encoded to have fewer zero "0" values.

16. The system of claim 13, wherein the data source component comprises a memory chip, the data destination component comprises a system-on-a-chip (SoC), and the first data communication interconnect comprises an inter-chip interconnect.

17. The system of claim 13, wherein the data destination component includes a memory controller configured to control the decoding.

18. The system of claim 13, wherein the data destination component includes a processor subsystem configured to control the decoding.

19. The system of claim 13, further comprising:
- a transition encoder configured to transition-encode the encoded data into transition-encoded data;
- a second data communication interconnect in the data destination component; and
- a transition decoder configured to receive the transition-encoded data over the second data communication interconnect and transition-decode the encoded data before the decoding of the encoded data.

20. The system of claim 13, wherein the encoded data comprises compressed data, and the data destination component further includes a decompressor configured to decompress the encoded data before the decoding of the encoded data.

21. The system of claim 20, wherein the compressed data consists of non-zero data and presence bits, the presence bits identifying the non-zero data in the data source component.

22. A system for transferring data in a computing device, comprising:
- a data source component; and
- a data destination component configured to receive encoded data from the data source component over a first data communication interconnect, the encoded data comprising Hamming weight-encoded data, the data destination component further configured to decode the encoded data received over the first data communication interconnect into decoded data, wherein the encoded data comprises data bus-inverted (DBI) data, and the data destination component further includes a DBI decoder configured to de-invert the DBI data before the decoding of the encoded data.

23. The system of claim 13, wherein the computing device is a portable computing device ("PCD") comprising one of: a cellular telephone, a satellite telephone, a laptop computer, a tablet, a navigation device, a smartbook, a personal digital assistant ("PDA"), an Internet-of-Things ("IoT") device, and an automotive computing device.

24. The system of claim 13, wherein the data source component determines encoding based on inspecting a frequency of observed symbols in data.

25. The system of claim 24, wherein the data source component maps original data to codewords based on a selected Hamming-weight code that reduces termination power.

26. A system for transferring data in a computing device, comprising:
- means for receiving encoded data by a data destination component of the computing device from a data source component of the computing device over a first data communication interconnect, the encoded data comprising Hamming weight-encoded data; and
- means for decoding the encoded data received over the first data communication interconnect into decoded data, wherein the encoded data comprises data bus-inverted (DBI) data, and further comprising means for de-inverting the DBI data before the means for decoding decodes the encoded data.

27. A system for transferring data in a computing device, comprising:
- means for receiving encoded data by a data destination component of the computing device from a data source component of the computing device over a first data communication interconnect, the encoded data comprising Hamming weight-encoded data; and
- means for decoding the encoded data received over the first data communication interconnect into decoded data, wherein the Hamming weight-encoded data comprises a minimum Hamming weight encoding where data is encoded to have fewer one "1" values.

28. A system for transferring data in a computing device, comprising:
- means for receiving encoded data by a data destination component of the computing device from a data source component of the computing device over a first data communication interconnect, the encoded data comprising Hamming weight-encoded data; and
- means for decoding the encoded data received over the first data communication interconnect into decoded data, wherein the Hamming weight-encoded data comprises a maximum Hamming weight encoding where data is encoded to have fewer zero "0" values.

29. The system of claim 26, wherein the data source component comprises a memory chip, the data destination component comprises a system-on-a-chip (SoC), and the first data communication interconnect comprises an inter-chip interconnect.

30. The system of claim 26, wherein the means for decoding is included in a memory controller.

31. The system of claim 26, further comprising means for providing the encoded data to a processor subsystem of the computing device, and wherein the means for decoding is included in the processor subsystem.

32. The system of claim 26, further comprising:
means for transition-encoding the encoded data into transition-encoded data;
means for receiving the transition-encoded data over a second data communication interconnect; and
means for transition-decoding the encoded data received over the second data communication interconnect.

33. The system of claim 26, wherein the encoded data comprises compressed data, and further comprising means for decompressing the encoded data before the means for decoding decodes the encoded data.

34. The system of claim 33, wherein the compressed data consists of non-zero data and presence bits, the presence bits identifying the non-zero data in the data source component.

35. A system for transferring data in a computing device, comprising:
means for receiving encoded data by a data destination component of the computing device from a data source component of the computing device over a first data communication interconnect, the encoded data comprising Hamming weight-encoded data; and
means for decoding the encoded data received over the first data communication interconnect into decoded data, wherein the data source component creates the encoded data prior to any runtime of software which needs the encoded data to complete a task.

36. The system of claim 35, wherein the data source component determines encoding based on inspecting a frequency of observed symbols in data.

37. The system of claim 36, wherein the data source component maps original data to codewords based on a selected Hamming-weight code that reduces termination power.

38. A computer-readable medium for transferring data in a computing device, the computer-readable medium comprising a non-transitory computer-readable medium having instructions stored thereon in computer-executable form, the instructions when executed by a processing system configuring the processing system to:
receive, at a data destination component of the computing device, encoded data from a data source component of the computing device over a first data communication interconnect, the encoded data comprising Hamming weight-encoded data; and
decode the encoded data received over the first data communication interconnect into decoded data, wherein the data source component creates the encoded data prior to any runtime of software which needs the encoded data to complete a task.

39. A computer-readable medium for transferring data in a computing device, the computer-readable medium comprising a non-transitory computer-readable medium having instructions stored thereon in computer-executable form, the instructions when executed by a processing system configuring the processing system to:
receive, at a data destination component of the computing device, encoded data from a data source component of the computing device over a first data communication interconnect, the encoded data comprising Hamming weight-encoded data; and
decode the encoded data received over the first data communication interconnect into decoded data, wherein the Hamming weight-encoded data comprises a minimum Hamming weight encoding where data is encoded to have fewer one "1" values.

40. A computer-readable medium for transferring data in a computing device, the computer-readable medium comprising a non-transitory computer-readable medium having instructions stored thereon in computer-executable form, the instructions when executed by a processing system configuring the processing system to:
receive, at a data destination component of the computing device, encoded data from a data source component of the computing device over a first data communication interconnect, the encoded data comprising Hamming weight-encoded data; and
decode the encoded data received over the first data communication interconnect into decoded data, wherein the Hamming weight-encoded data comprises a maximum Hamming weight encoding where data is encoded to have fewer zero "0" values.

41. The computer-readable medium of claim 38, wherein the data source component comprises a memory chip, the data destination component comprises a system-on-a-chip (SoC), and the first data communication interconnect comprises an inter-chip interconnect.

42. The computer-readable medium of claim 38, wherein the processing system comprises a memory controller.

43. The computer-readable medium of claim 38, wherein the instructions further configure the processing system to receive the encoded data under control of a memory controller and to control the decoding.

44. The computer-readable medium of claim 38, wherein the computing device is a portable computing device ("PCD") comprising one of: a cellular telephone, a satellite telephone, a laptop computer, a tablet, a navigation device, a smartbook, a personal digital assistant ("PDA"), an Internet-of-Things ("IoT") device, and an automotive computing device.

45. The computer-readable medium of claim 38, wherein the data source component determines encoding based on inspecting a frequency of observed symbols in data.

46. The computer-readable medium of claim 45, wherein the data source component maps original data to codewords based on a selected Hamming-weight code that reduces termination power.

* * * * *